(12) United States Patent
Demetriou et al.

(10) Patent No.: US 11,202,392 B2
(45) Date of Patent: Dec. 14, 2021

(54) MULTI-COOLANT HEAT EXCHANGER FOR AN ELECTRONICS RACK

(71) Applicant: INTERNATIONAL BUSINESS MACHINES CORPORATION, Armonk, NY (US)

(72) Inventors: Dustin W. Demetriou, New York, NY (US); Michael J. Ellsworth, Jr., Lagrangeville, NY (US); Milnes P. David, New Paltz, NY (US); Prabjit Singh, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 292 days.

(21) Appl. No.: 16/654,298

(22) Filed: Oct. 16, 2019

(65) Prior Publication Data

US 2021/0120704 A1    Apr. 22, 2021

(51) Int. Cl.
*H05K 7/20* (2006.01)

(52) U.S. Cl.
CPC ..... *H05K 7/20781* (2013.01); *H05K 7/20172* (2013.01); *H05K 7/20263* (2013.01); *H05K 7/20272* (2013.01); *H05K 7/20736* (2013.01)

(58) Field of Classification Search
CPC ........... H05K 7/20781; H05K 7/20263; H05K 7/20172; H05K 7/20736; H05K 7/20272
See application file for complete search history.

(56) References Cited

U.S. PATENT DOCUMENTS

| | | |
|---|---|---|
| 3,025,596 A | 3/1962 | Ward et al. |
| 3,323,586 A | 6/1967 | Burne et al. |

(Continued)

FOREIGN PATENT DOCUMENTS

| | | |
|---|---|---|
| CA | 1121801 A | 4/1982 |
| CN | 101507352 A | 8/2009 |
| WO | WO 2010/112873 A1 | 10/2010 |

OTHER PUBLICATIONS

Mynampati, Venkata Naga Poornima, "Alternative Cooling Technologies for Tele-Communication Data Centers: Air Cooling and Rear Door Heat Exchangers", The University of Texas at Arlington, Dec. 2010 (86 pages).

*Primary Examiner* — Emmanuel E Duke
(74) *Attorney, Agent, or Firm* — Tihon Poltavets, Esq.; Kevin P. Radigan, Esq.; Heslin Rothenberg Farley & Mesiti P.C.

(57) ABSTRACT

An air-to-coolant heat exchanger for an electronics rack is provided, which includes first and second tube segments, one or more connector segments, and a plurality of thermally conductive fins attached to the tube segments. The first tube segment includes a first inner tube positioned within a first outer tube, defining a first inner coolant-carrying channel and first outer coolant-carrying channel, and the second tube segment has a second inner tube positioned within a second outer tube, defining a second inner coolant-carrying channel and second outer coolant-carrying channel. The connector segment(s) couples in fluid communication at least one of the first and second inner coolant-carrying channels, or the first and second outer coolant-carrying channels. The heat exchanger is coupled to separately receive a first coolant and a second coolant, with the first coolant passing through the inner channels, and the second coolant through the outer channels.

20 Claims, 15 Drawing Sheets

(56) References Cited

U.S. PATENT DOCUMENTS

| | | | |
|---|---|---|---|
| 3,860,269 A * | 1/1975 | Horton | F16L 39/005 285/47 |
| 4,096,616 A | 6/1978 | Coffinberry | |
| 7,315,448 B1 * | 1/2008 | Bash | H05K 7/2079 165/80.3 |
| 7,385,810 B2 | 6/2008 | Chu et al. | |
| 7,660,116 B2 | 2/2010 | Classen et al. | |
| 7,760,502 B2 | 7/2010 | Meyer, III et al. | |
| 7,963,118 B2 | 6/2011 | Porter et al. | |
| 8,347,641 B2 | 1/2013 | Bean et al. | |
| 8,693,198 B2 | 4/2014 | Eckberg et al. | |
| 8,919,143 B2 * | 12/2014 | Eckberg | H05K 7/2079 62/259.2 |
| 8,941,993 B2 | 1/2015 | Eckberg et al. | |
| 9,025,331 B2 | 5/2015 | Campbell et al. | |
| 9,258,931 B2 | 2/2016 | Iyengar et al. | |
| 9,261,310 B2 | 2/2016 | Fried | |
| 9,408,332 B2 | 8/2016 | Smith | |
| 9,743,560 B2 | 8/2017 | Chen | |
| 2006/0254753 A1 | 11/2006 | Phillips et al. | |
| 2011/0223508 A1 | 2/2011 | Bean et al. | |
| 2011/0232889 A1 * | 9/2011 | Eckberg | F28D 1/0477 165/200 |
| 2012/0255706 A1 | 10/2012 | Tadayon et al. | |
| 2013/0118712 A1 * | 5/2013 | Iyengar | H05K 7/20736 165/104.14 |
| 2013/0264027 A1 * | 10/2013 | Eckberg | F28F 27/00 165/67 |
| 2013/0299137 A1 | 11/2013 | Iyengar et al. | |
| 2014/0133096 A1 * | 5/2014 | Campbell | F28F 9/00 361/694 |
| 2016/0057894 A1 | 2/2016 | Chen | |
| 2016/0143191 A1 | 5/2016 | Smith | |
| 2018/0139870 A1 * | 5/2018 | Meadows | F28D 1/0443 |

* cited by examiner

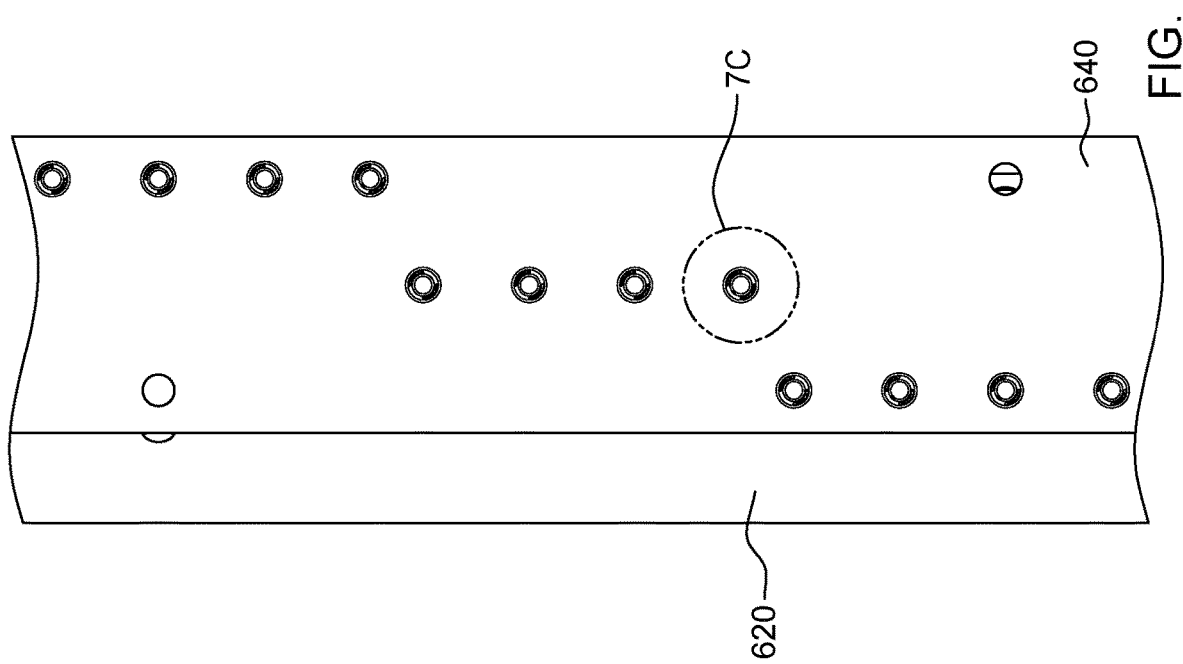
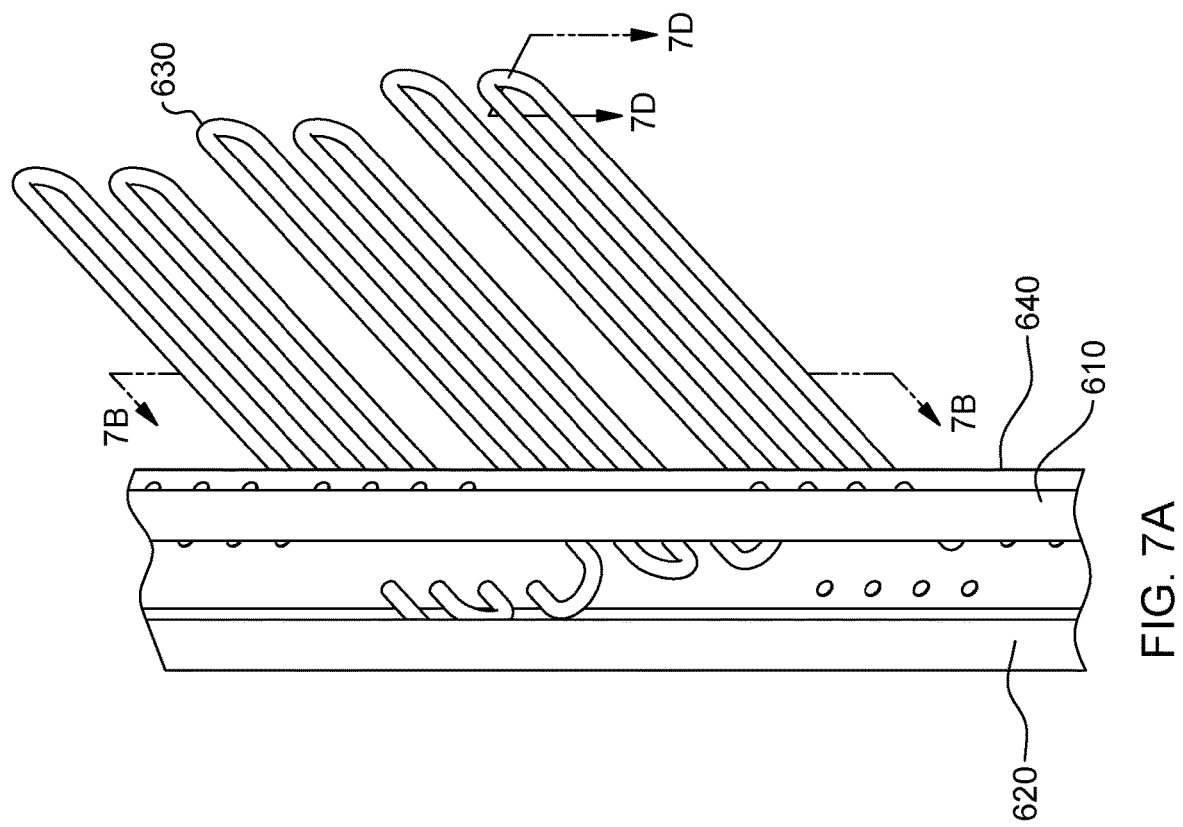

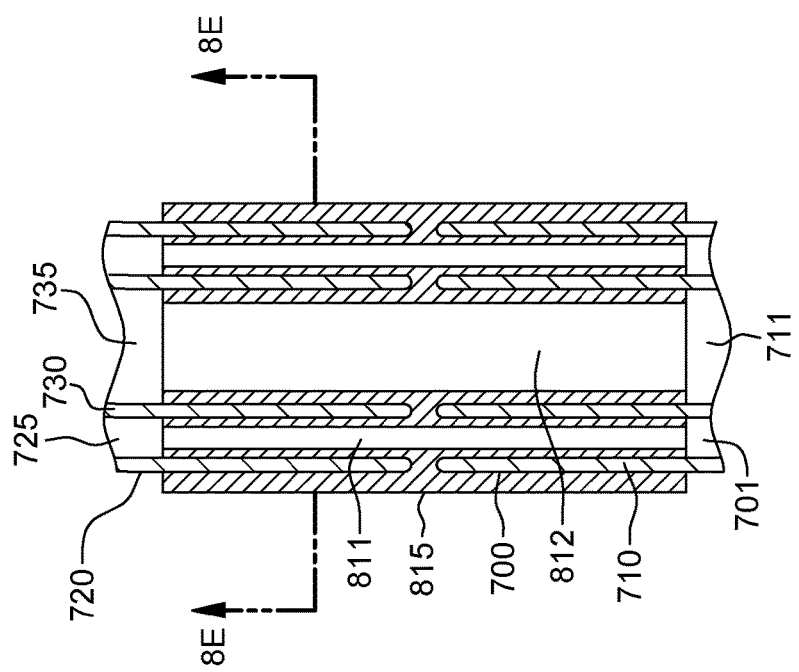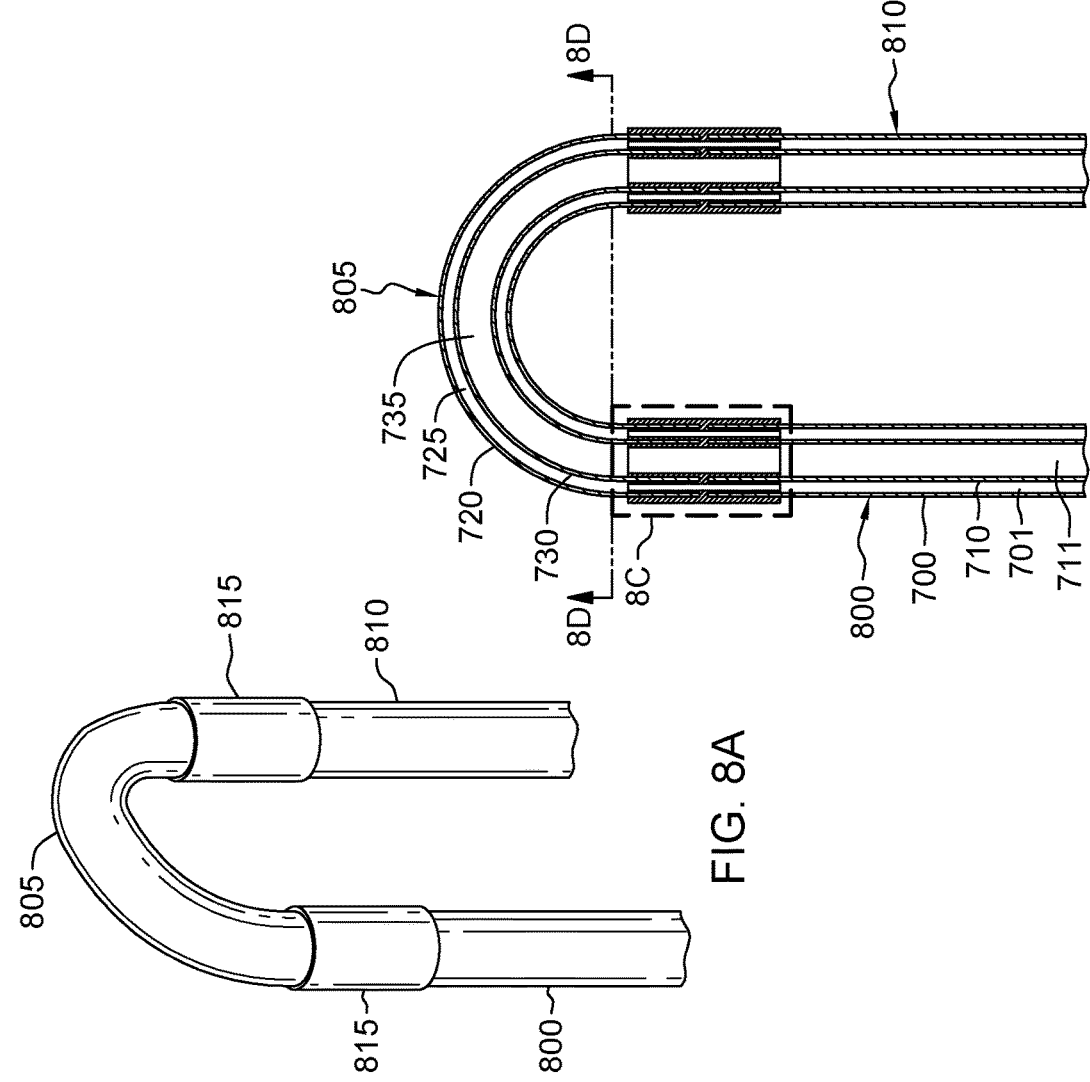

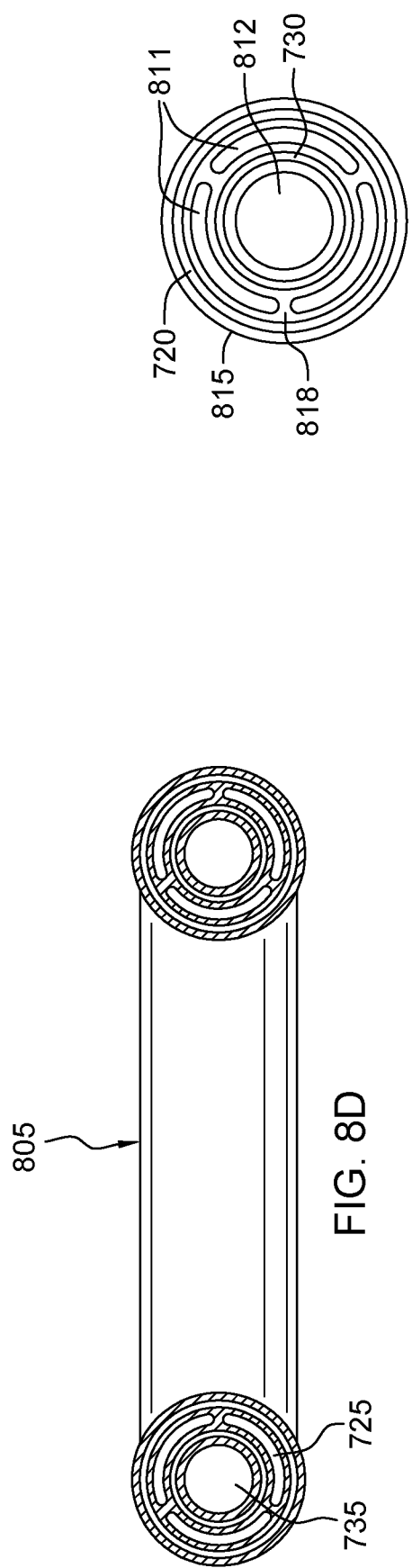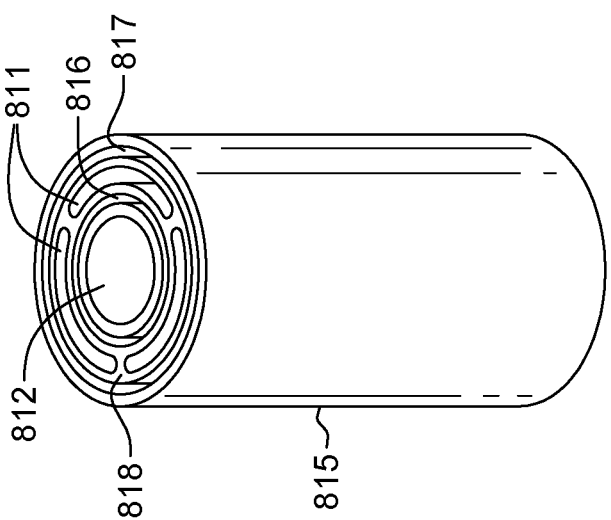

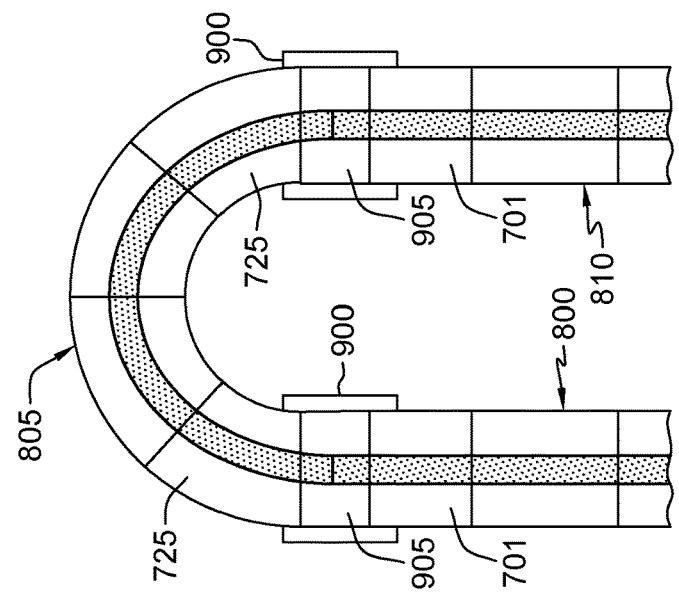
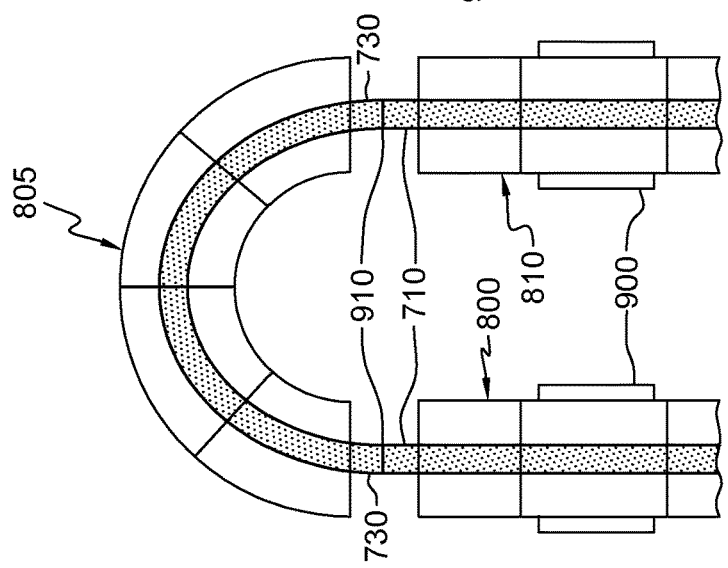
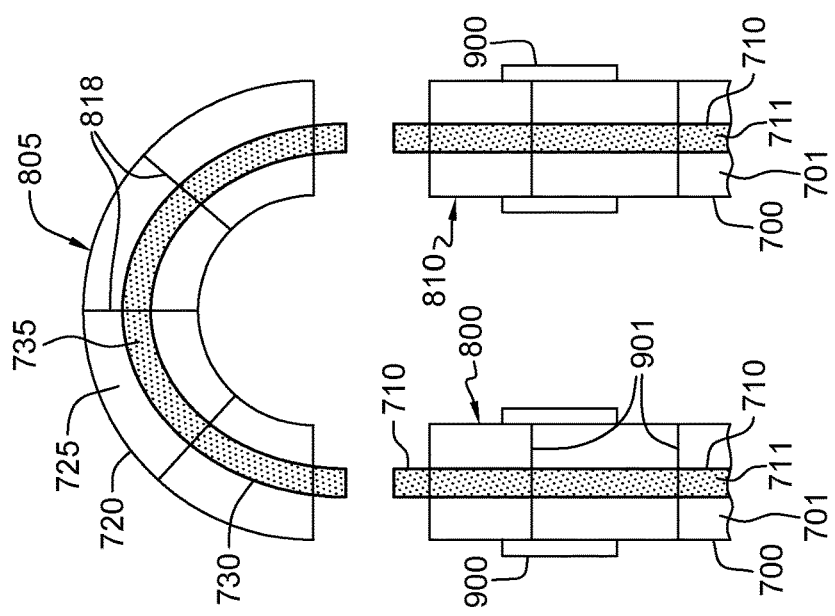

MULTI-COOLANT HEAT EXCHANGER FOR AN ELECTRONICS RACK

BACKGROUND

In many applications, including large server applications, processors, along with their associated electronics (e.g., memory, disk drives, power supplies, etc.), are packaged in removable drawer configurations stacked within a rack or frame. In other cases, the electronics can be in fixed locations within the rack or fame. Typically, the components are cooled by air moving in parallel airflow paths, usually front-to-back, impelled by one or more air-moving devices.

The sensible heat load carried by the air exiting the rack can stress the capability of the room air-conditioning to effectively handle the load. This is especially true for large installations of "server farms", or large banks of computer racks close together. In such installations, liquid-cooling is an attractive technology to help manage the higher heat fluxes.

SUMMARY

Certain shortcomings of the prior art are overcome and additional advantages are provided through the provision, in one or more aspects, of an apparatus which includes an air-to-coolant heat exchanger configured to cool, at least in part, air passing through an electronics rack. The heat exchanger includes a first tube segment, a second tube segment, at least one connector segment, and a plurality of thermally conductive fins attached to the first and second tube segments. The first tube segment has a first inner tube positioned within a first outer tube, which defines a first inner coolant-carrying channel and a first outer coolant-carrying channel. The second tube segment includes a second inner tube positioned within a second outer tube, which defines a second inner coolant-carrying channel and a second outer coolant-carrying channel. The at least one connector segment couples in fluid communication at least one of the first and second inner coolant-carrying channels of the first and second tube segments, or the first and second outer coolant-carrying channels of the first and second tube segments. The air-to-coolant heat exchanger is coupled to separately receive a first coolant and a second coolant, with the first coolant passing through the first and second inner coolant-carrying channels, and second coolant passing through the first and second outer coolant-carrying channels.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is a partial depiction of the multi-coolant heat exchanger embodiment of FIGS. 6A-6D, in accordance with one or more aspects of the present invention;

FIG. 7B is a cross-sectional depiction of the multi-coolant heat exchanger of FIG. 7A, taken along line 7B-7B thereof, in accordance with one or more aspects of the present invention;

FIG. 8A is a partial depiction of one embodiment of a multi-coolant heat exchanger section of a multi-coolant heat exchanger, such as depicted in FIGS. 6A-7D, in accordance with one or more aspects of the present invention;

FIG. 8B is a cross-sectional plan view of the multi-coolant heat exchanger section of FIG. 8A, in accordance with one or more aspects of the present invention;

FIG. 8C is an enlarged cross-sectional view of the fitting connection of FIG. 8B, taken along line 8C thereof, in accordance with one or more aspects of the present invention;

FIG. 8D is a cross-sectional view of one embodiment of the curved connector segment of the multi-coolant heat exchanger section of FIG. 8B, taken along line 8D-8D thereof, in accordance with one or more aspects of the present invention;

FIG. 8E is a cross-sectional plan view of the fitting connection of FIG. 8C, taken along line 8E-8E thereof, in accordance with one or more aspects of the present invention;

FIG. 8F is an enlarged depiction of one embodiment of the fitting of FIGS. 8A-8C & 8E, in accordance with one or more aspects of the present invention;

FIGS. 9A-9C partially depict an alternate tube connection embodiment for a multi-coolant heat exchanger section of a multi-coolant heat exchanger, such as depicted in FIGS. 6A-7D, in accordance with one or more aspects of the present invention.

DETAILED DESCRIPTION

Figure 1A:
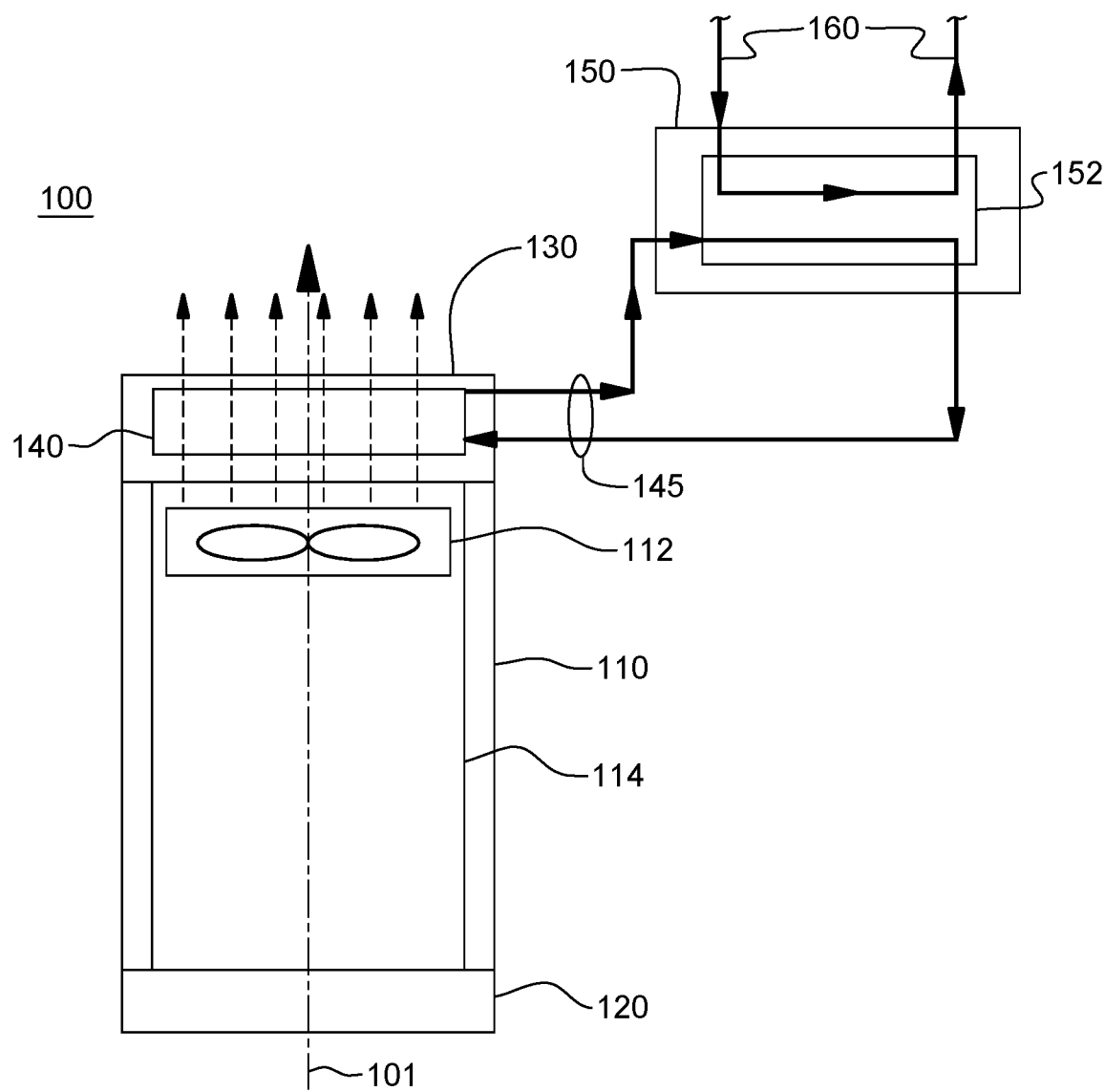
FIG. 1A is a plan view of one embodiment of an electronics rack with a heat exchanger door mounted to an air-outlet side thereof.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description in this specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of a multi-coolant heat exchanger and/or heat exchanger door for an electronics rack.

As used herein, an air-to-coolant heat exchanger refers to any heat exchange mechanism characterized as described herein through which one or multiple coolants can circulate, depending on the embodiment; and includes, one or more discrete air-to-coolant heat exchangers coupled either in series or in parallel. An air-to-coolant heat exchanger can include, for example, one or more coolant flow paths, formed of thermally conductive tubings (such as copper or other tubing) in thermal or mechanical contact with a plurality of air-cooled cooling fins (such as aluminum or other fins). Unless otherwise specified, size, configuration and construction of the air-to-coolant heat exchanger can vary without departing from the scope of the invention disclosed herein. Further, a coolant-to-liquid heat exchanger can include, for example, two or more coolant flow paths, formed of thermally conductive tubings (such as copper or other tubing) in thermal or mechanical contact with each other to facilitate conduction of heat therebetween. Size, configuration and construction of the coolant-to-liquid heat exchanger can also vary without departing from the scope of the invention disclosed herein.

One example of facility coolant and system coolant is water. However, the concepts disclosed herein are readily adapted to use with other types of coolant. For example, one or more of the coolants can include a water-glycol mixture, a brine, a fluorocarbon liquid, a liquid metal, or other similar coolant, or a refrigerant, while still maintaining the advantages and unique features of the present invention. Further, the term coolant refers to any liquid or gas, or combination thereof, used to remove heat, in accordance with the structures and concepts disclosed herein.

Reference is made below to the drawings, which are not drawn to scale to facilitate an understanding of the invention, wherein the same reference numbers used throughout different figures designate the same or similar components.

Figure 1B:
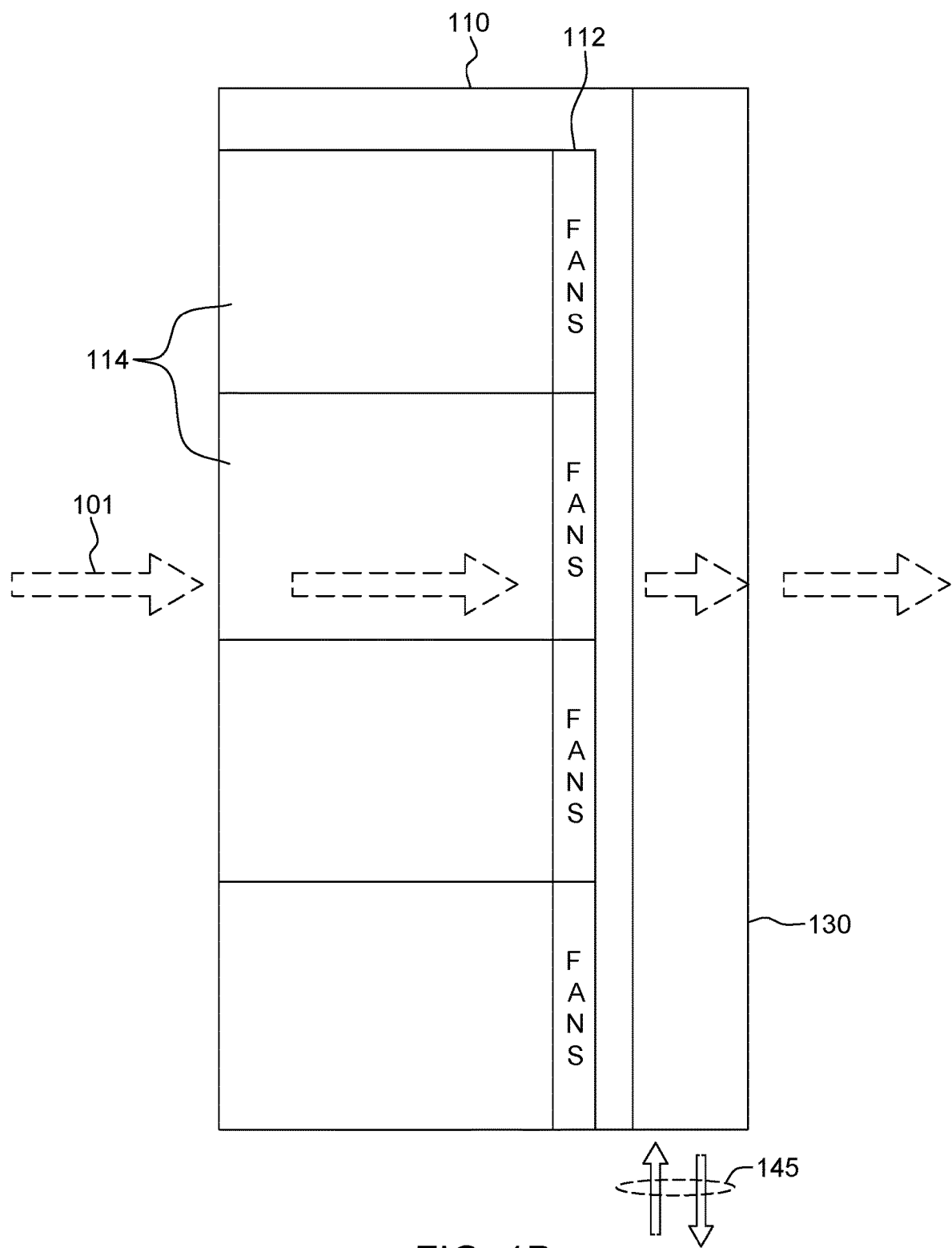
FIG. 1B is a side elevational depiction of one embodiment of the electronics rack and heat exchanger door of FIG. 1A.

Referring collectively to FIGS. 1A & 1B, these figures depict one embodiment of a cooled electronic system, generally denoted 100, which includes an electronics rack 110 having an inlet door 120 and an outlet door 130. The inlet and outlet doors have openings to allow for the ingress and egress of air 101, respectively, through the air-inlet side and air-outlet side of electronics rack 110. The system further includes at least one air-moving device 112 for moving air across at least one electronic system or component 114 disposed within the electronics rack. Located within outlet door 130 is an air-to-coolant heat exchanger 140 across which the inlet-to-outlet airflow 101 through the electronics rack passes. As shown in FIG. 1A, a system coolant loop 145 couples air-to-coolant heat exchanger 140 to a coolant distribution unit 150. Coolant distribution unit 150 can be used to buffer the air-to-coolant heat exchanger from facility coolant in a facility coolant loop 160. Air-to-coolant heat exchanger 140 removes heat from the exhausted inlet-to-outlet airflow 101 through the electronics rack via circulating system coolant, for rejection in coolant distribution unit 150 to facility coolant in facility coolant loop 160, for example, via a coolant-to-liquid heat exchanger 152 disposed therein. This cooling apparatus can advantageously reduce heat load on the existing air-conditioning unit(s) within the data center, and facilitates cooling of electronics racks by cooling (in one embodiment) the air egressing from the electronics rack and thus cooling any air recirculating to the air-inlet side thereof.

In one implementation, inlet and outlet coolant manifolds (or plenums) of the air-to-coolant heat exchanger are also mounted within the heat exchanger door and are coupled to respective coolant supply and return lines disposed, for example, beneath a raised floor. Alternatively, overhead system coolant supply and return lines can be provided for the air-to-coolant heat exchangers. In such an embodiment, system coolant would enter and exit the respective coolant inlet and outlet manifolds from the top of the rack door, for example, using flexible coolant supply and return hoses, which can be at least partially looped and sized to facilitate opening and closing of the heat exchanger door. Structures can be provided at the ends of the hoses to relive stress at the hose ends, which might result from opening or closing of the door.

Figure 2:
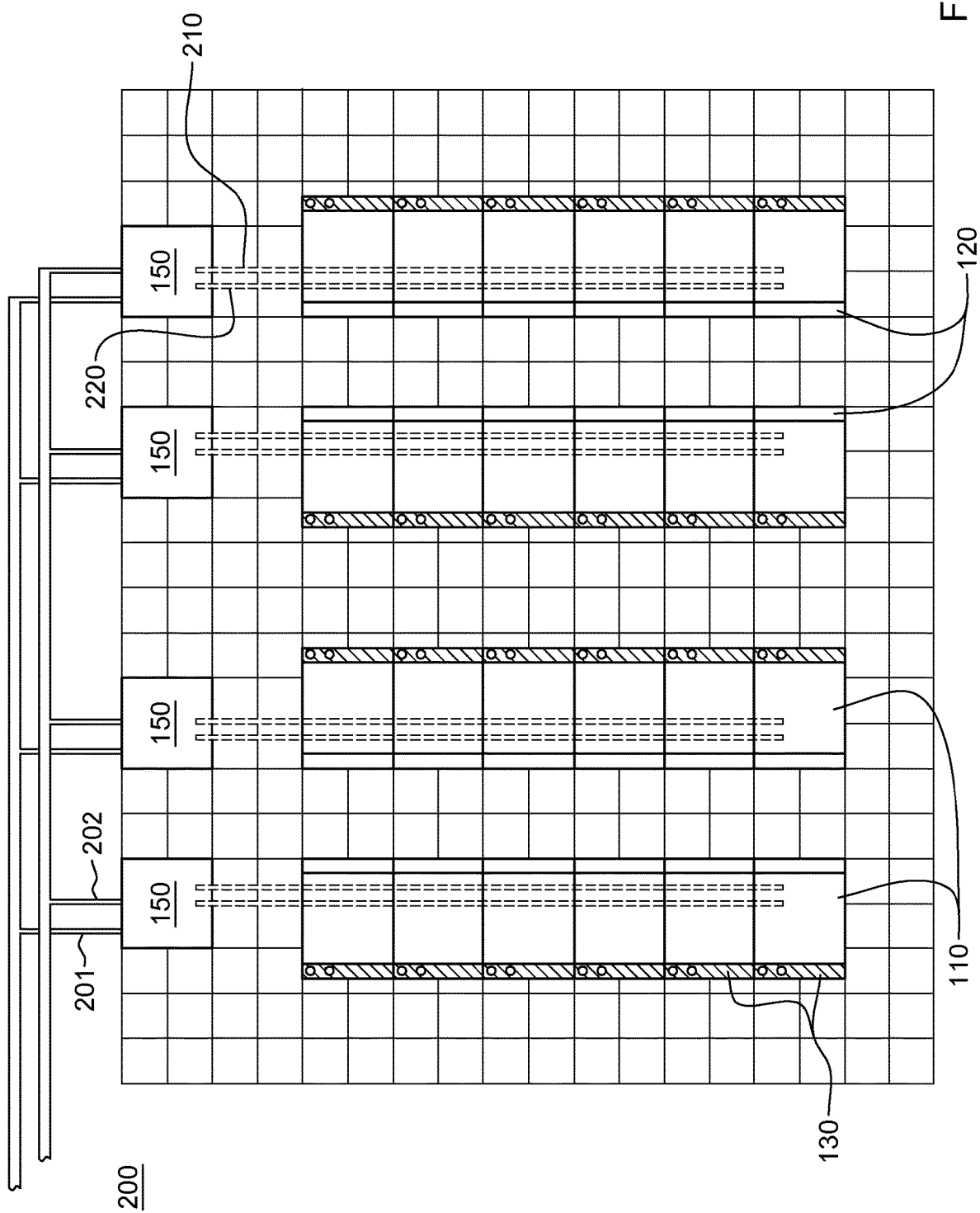
FIG. 2 depicts one embodiment of a data center layout including multiple coolant distribution units providing a coolant to a plurality of electronics racks, with heat exchanger doors mounted to an air-inlet side or air-outlet side thereof.

FIG. 2 is a plan view of one embodiment of a data center, generally denoted 200, with cooled electronic systems having door-mounted, air-to-coolant heat exchangers, such as disclosed herein. Data center 200 includes a plurality of rows of electronics racks 110, each of which includes (by way of example only) an inlet door 120 at the air-inlet side, and a hinged heat exchanger door 130 at the air-outlet side, such as described above in connection with the embodiment of FIGS. 1A & 1B. In this embodiment, each heat exchanger door 130 includes an air-to-coolant heat exchanger and system coolant inlet and outlet manifolds or plenums. Multiple coolant conditioning units 150, which function in part as coolant pumping units, are disposed within the data center (possibly along with one or more air-conditioning units (not shown)). By way of example only, each pumping unit can form a system coolant distribution subsystem with one row of a plurality of electronics racks. Each pumping unit includes a coolant-to-liquid heat exchanger where heat is transferred from a system coolant loop to a facility coolant loop. In operation, chilled facility coolant, such as water, is received via a facility coolant supply line 201, and returned via a facility coolant return line 202. System coolant, such as water, is provided via a system coolant supply manifold 210 extending (in one embodiment) below the respective row of electronics racks, and is returned via a system coolant return manifold 220 also extending (in one embodiment) below the respective row of electronics racks. In one implementation, the system coolant supply and return manifolds 210, 220 are hard-plumbed within the data center, for example, within an air supply plenum of the data center, and can be preconfigured to align under and include branch lines (or hoses) extending towards the electronics racks in a respective row of racks.

Figure 3:
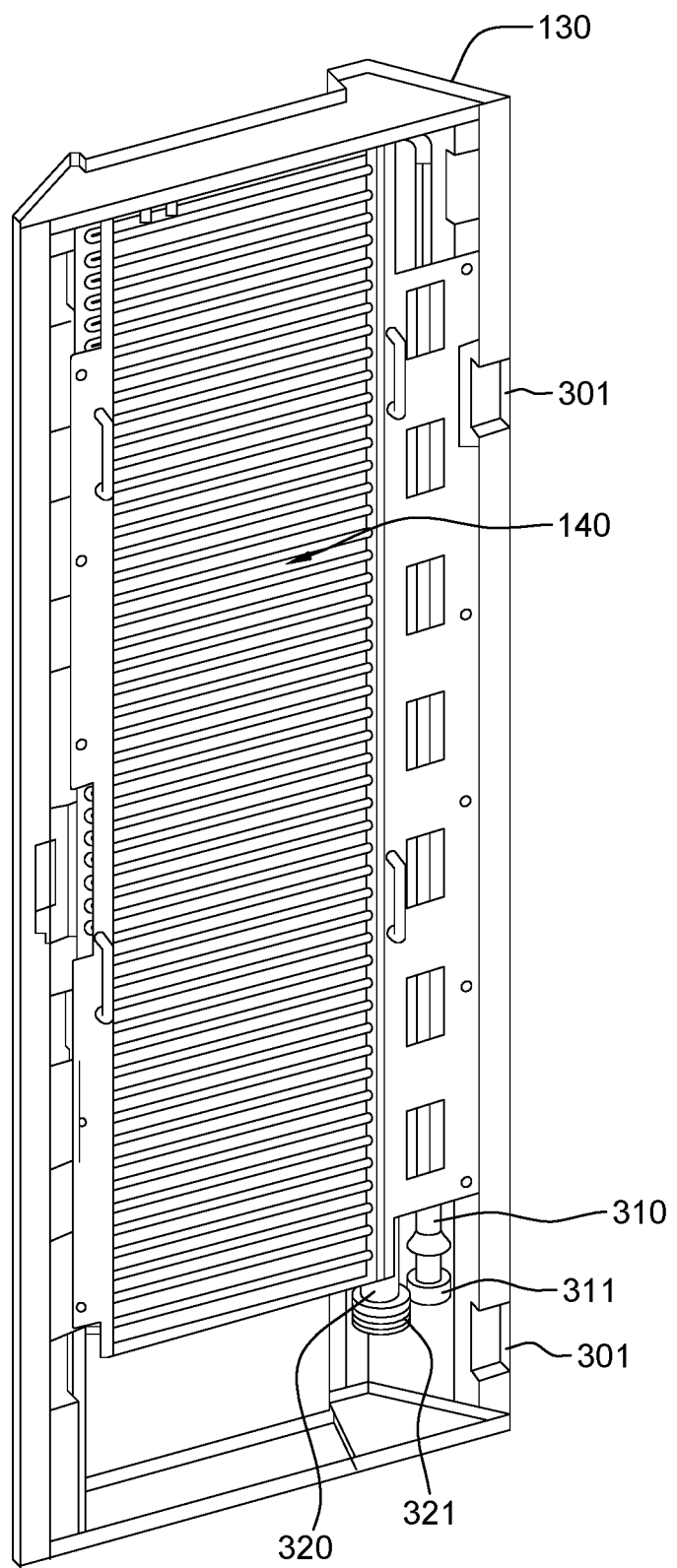
FIG. 3 depicts one embodiment of a partially assembled heat exchanger door.

FIG. 3 depicts one version of a heat exchanger door for mounting to an electronics rack, such as described above in connection with FIGS. 1A-2. This embodiment represents one version of an outlet door 130 with an air-to-coolant heat exchanger 140 mounted therein. In this embodiment, a coolant inlet manifold 310 and coolant outlet manifold 320 are provided along a hinge edge 301, which is configured to facilitate hinged mounting of the outlet door to an electronics rack. In one embodiment, the coolant inlet and outlet manifolds 310, 320 further include couplings, such as quick connect couplings 311, 321 within the outlet door that are aligned vertically with the coolant inlet and outlet manifolds.

A heat exchanger door, such as depicted in FIG. 3, includes a cooling device, and replaces (for example) a door of an electronics rack. When incorporated as an outlet door, the heat exchanger door does not provide any direct cooling to the electronic components within the electronics rack, but rather facilitates a reduction in the exhaust air temperature into the data center that could re-circulate to the air-inlet side, as well as reduces the heat load to be removed by, for example, any computer room air-conditioning units, and thus, facilitates management of the heat load within the data center. Depending on the implementation, since the temperature of air leaving the electronics rack via a heat exchanger door, such as disclosed herein, can be as cold as or colder than the air entering the electronics rack, usage of the heat exchanger door can decrease or even eliminate the need for computer room air-conditioners within the data center.

Advantages of using a heat exchanger door configured as disclosed herein include: the ability to support a higher power-rack load than can otherwise be supported by traditional air-cooling of the data center alone; elimination of the uncomfortable hot aisle/cold aisle data center floor configuration; elimination of the need for hot aisle and/or cold aisle containment; significantly improved energy efficiency, that is, as compared with conventional air-cooling, where the typical air-cooled data center must pay for the electrical power used by the blowers and the computer room air-conditioner to force the chilled air under the floor and through the perforated tiles on the floor, to the inlet sides of the electronics racks; utilizes one or more coolants (such as water), which can result in a significant reduction in the cooling cost of a data center; solving the hot spot issues within a data center due to recirculation of exhaust air; is a passive apparatus, requiring no power at the heat exchanger door, and depending on the implementation, requires no additional rack fans or control elements which would need to be purchased or replaced if failed; and creates no extra noise within the data center environment.

Disclosed herein are various enhancements to the air-cooling apparatus and heat exchanger door configuration described above in connection with FIGS. 1A-3. There are two primary objectives in designing a heat exchanger door, which are in opposition to each other. These objectives are:
  1. A desire to maximize the amount of heat which can be removed from the air stream. In a simplest form, this can be accomplished by increasing the fin density of the heat exchanger core.
  2. A desire to minimize the air-side pressure drop across the heat exchanger. Since in certain embodiments disclosed herein the heat exchanger door does not have any fans of its own, the fans in the existing electronics rack need to provide enough flow to counteract the impedance of airflow through the electronic system(s) (e.g., server(s)), as well as through the heat exchanger door. For a fixed fan speed, the net airflow rate delivered by the fans will decrease as the impedance of the heat exchanger door increases. This decrease in airflow might trigger thermal sensors to signal for more airflow by increasing the speed (RPMs), power consumption, and thus noise of the fans or other air-moving devices. If the air-moving devices are already at their maximum speed, they are unable to increase speed, and increased component temperatures will result. Therefore, maintaining a very low airflow impedance for the heat exchanger door is important to a commercially successful implementation.

Since power consumption continues to dramatically increase within the electronics rack, provided herein are various enhancements to the above-described heat exchanger door, which can result, for example, in overall improvement in heat removal and energy efficiency compared to the outlet door version depicted in FIG. 3, without increasing the air-side pressure drop (impedance). Other objectives in designing a heat exchanger door include: minimizing coolant-side flow rate and pressure drop requirements to minimize pumping costs (operating expenses); minimize weight of the door itself, which must be shipped and installed; minimize costs (that is, minimize capital expense); minimize thickness of the door to decrease the footprint of the electronics rack and heat exchanger door together; and ensure flow uniformity across the parallel flow paths through the heat exchanger door.

As noted, disclosed herein are numerous modifications and enhancements to a heat exchanger door, which are presented with the goal of enhancing the amount of heat which can be removed from the airstream passing through the electronics rack, while minimizing cooling costs. Also, the heat exchanger door disclosed herein can be employed at either the air-inlet side or the air-outlet side of the electronics rack, or both, with the discussion presented below assuming that the heat exchanger door is mounted to the air-outlet side of an electronics rack, by way of example only.

Note that the air-to-coolant heat exchanger disclosed herein is advantageously designed to function without added air-moving devices within the electronics rack or within the heat exchanger door. Therefore, air impedance of the heat exchanger door is designed to be as low as possible. This is achieved by controlling various design variables, including, for example, the number of coolant tubes, size of coolant tubes employed in the tube sections of the heat exchanger and the locating of tubes within other tubes, and the number, configuration, thickness, and depth in the airflow direction of the fins used in the air-to-coolant heat exchanger. The materials and wall thicknesses can be chosen to accommodate the air impedance design. Strict brazing processing definition and control can be employed, along with multiple test points in the build process, for robust, controlled component fabrication. In combination, these considerations contribute to ensure a leak-proof, highly reliable product which meets the design objectives.

Generally stated, disclosed herein is an air-cooling apparatus which includes a heat exchanger door configured to hingedly mount to one of an air-inlet side or an air-outlet side of an electronics rack, wherein air moves through the electronics rack from the air-inlet side to the air-outlet side thereof. The heat exchanger door includes a door frame sized and configured to span at least a portion of the air-inlet side or the air-outlet side of the electronics rack, and an air-to-coolant heat exchanger supported by the door frame. The door frame includes an airflow opening which facilitates the ingress or egress of airflow through the electronics rack with the heat exchanger door mounted thereto, and the air-to-coolant heat exchanger is configured and disposed so that airflow through the airflow opening passes across the air-to-coolant heat exchanger. The air-to-coolant heat exchanger is configured to extract heat from airflow passing thereacross.

In one or more aspects, apparatuses and methods are provided herein which include an air-to-coolant heat exchanger configured to cool, at least in part, air passing through an electronics rack. The air-to-coolant heat exchanger includes a first tube segment, a second tube segment, and at least one connector segment. The first tube segment has a first inner tube positioned within a first outer tube, and defining a first inner coolant-carrying channel and a first outer coolant-carrying channel, and the second tube segment has a second inner tube positioned within a second outer tube, and defining a second inner coolant-carrying channel and a second outer coolant-carrying channel. The at least one connector segment couples in fluid communication at least one of the first and second inner coolant-carrying channels of the first and second tube segments, or the first and second outer coolant-carrying channels of the first and second tube segments. The heat exchanger further includes a plurality of thermally conductive fins attached to the first and second tube segments. The air-to-coolant heat exchanger is coupled to separately receive a first coolant and a second coolant, with the first coolant passing through the first and second inner coolant-carrying channels, and the second coolant passing through the first and second outer coolant-carrying channels. In one embodiment, both the first coolant and the second coolant assist in cooling, at least in part, the air passing through the electronics rack, such as, for instance, the air ingressing into the electronics rack or air egressing from the electronics rack.

In one or more implementations, the first tube segment is a first concentric tube segment with the first inner tube concentrically positioned with respect to the first outer tube, and the second tube segment is a second concentric tube segment with the second inner tube concentrically positioned with respect to the second outer tube.

Further, in one or more implementations, the first coolant is a lower-temperature fluid and the second coolant is a higher-temperature fluid, with the higher-temperature fluid being at a higher temperature than the lower-temperature fluid. In one embodiment, the lower-temperature fluid is a refrigeration-cooled fluid, and the higher-temperature fluid is an outside-heat-sink-cooled fluid. In this configuration, the apparatus can cool air passing through the electronics rack using the higher-temperature fluid when appropriate, and provide backup cooling using the lower-temperature fluid when needed. Advantageously, the higher-temperature fluid and the lower-temperature fluid are maintained separate so that, for instance, the fluid streams can be used in other locations within the data center.

Figure 4:
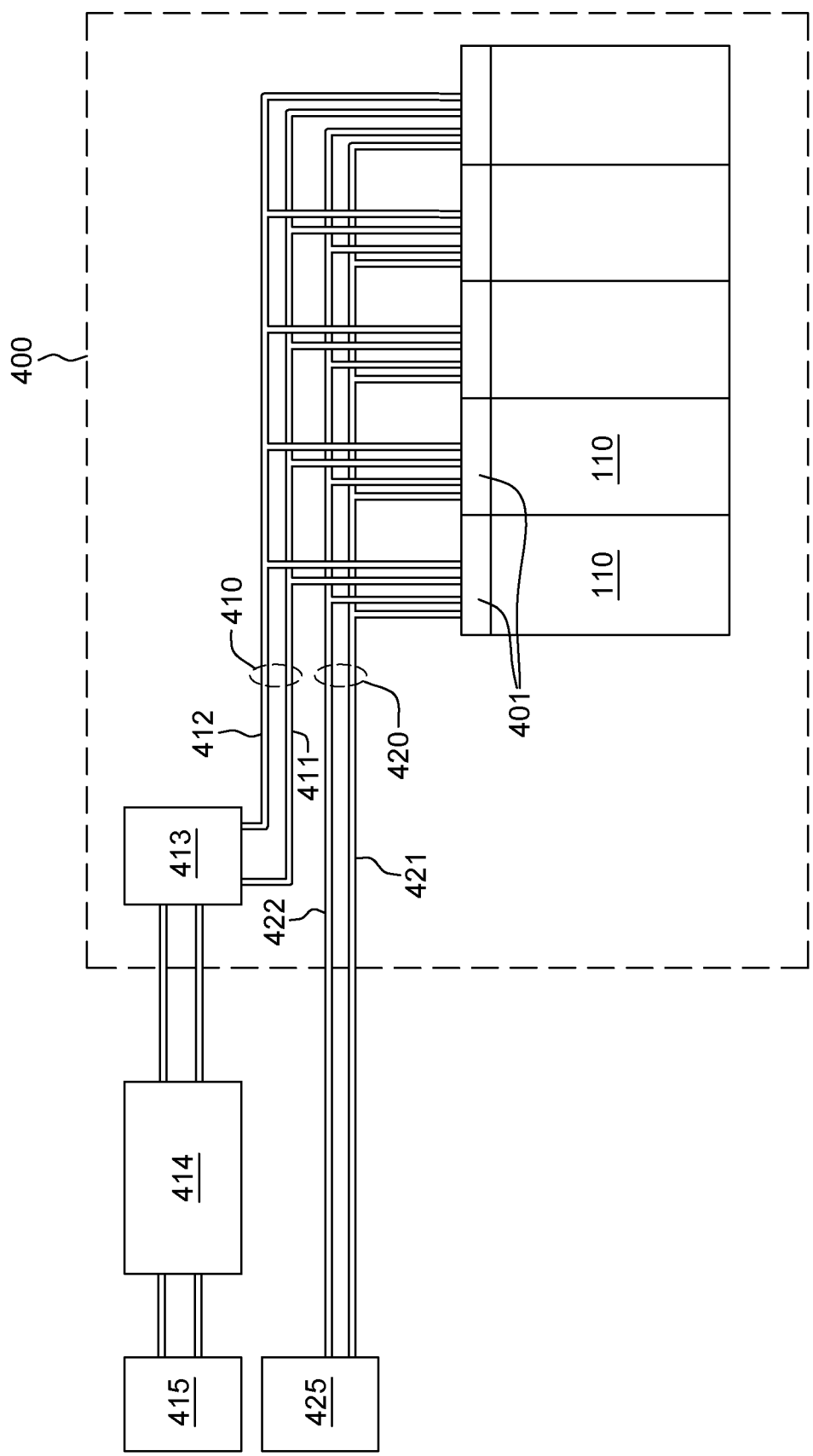
FIG. 4 depicts a further embodiment of a data center layout with first and second coolant sources providing first and second coolants to respective multi-coolant heat exchangers of heat exchanger doors mounted to multiple electronics racks, in accordance with one or more aspects of the present invention.

FIG. 4 depicts one embodiment of a data center, generally denoted 400, with cooled electronic systems including heat exchanger doors 401 mounted to the air-inlet side or air-outlet side of electronics racks 110 within data center 400. In the embodiment depicted, each heat exchanger door 401 includes an air-to-coolant heat exchanger configured to receive a first coolant from a first coolant source or loop 410, and a second coolant from a second coolant source or loop 420. As illustrated, first coolant source 410 includes a first coolant supply line 411 and a first coolant return line 412, and second coolant source 420 includes a second coolant supply line 421 and a second coolant return line 422. In one embodiment, first coolant source 410 dissipates first coolant heat via a coolant distribution unit 413 that is cooled by a refrigeration chiller 414, which rejects heat to an outside heat sink 415, such as an air-cooled cooling tower. In one or more embodiments, the first coolant of the first coolant source or loop 410 is cooled directly or indirectly via refrigerant within the refrigeration chiller 414 to a desired temperature or temperature range, and is circulated via one or more pumps of coolant distribution unit 413.

In the embodiment depicted, second coolant source or loop 420 includes a second coolant circulating through a second coolant supply line 421 and a second coolant return line 422, with heat removed via an outside heat sink 425, such as an ambient air-cooled heat sink or river water or lake water-cooled heat sink. For instance, an ambient air-cooled heat sink could be configured as an air-cooled cooling tower. In one embodiment, the second coolant can be circulated through second coolant source or loop 420 via one or more pumps of a coolant distribution unit or coolant-conditioning unit (not shown), or one or more pumps associated with outside heat sink 425.

In one or more implementations, the first coolant of first coolant source 410 is a lower-temperature fluid, for instance, a lower-temperature water, than the second coolant of second coolant source 420, which is referred to herein as a higher-temperature fluid, such as a higher-temperature water. Note that as used herein, "higher" is relative to the lower temperature fluid, and that both the higher-temperature and the lower-temperature fluid are of sufficiently low temperature to cool air passing through the electronics rack. By way of example, the low-temperature fluid can be in the range of 10°-17° C., and the high-temperature fluid can be in the range of 17°-32° C. Further note that the second coolant in the second coolant source 420 is passively cooled, with the temperature of the second coolant being dependent on outdoor ambient conditions, and the first coolant of first coolant source 410 is actively cooled to a desired temperature or temperature range via refrigeration chiller 414.

As noted, in one or more implementations, the first coolant and the second coolant do not mix in the cooling system. As described herein, in one or more implementations, the inner tubes of the multi-coolant heat exchangers are connected to receive the lower-temperature fluid, and the outer tubes of the multi-coolant heat exchangers are connected to receive the higher-temperature fluid.

Figure 5A:
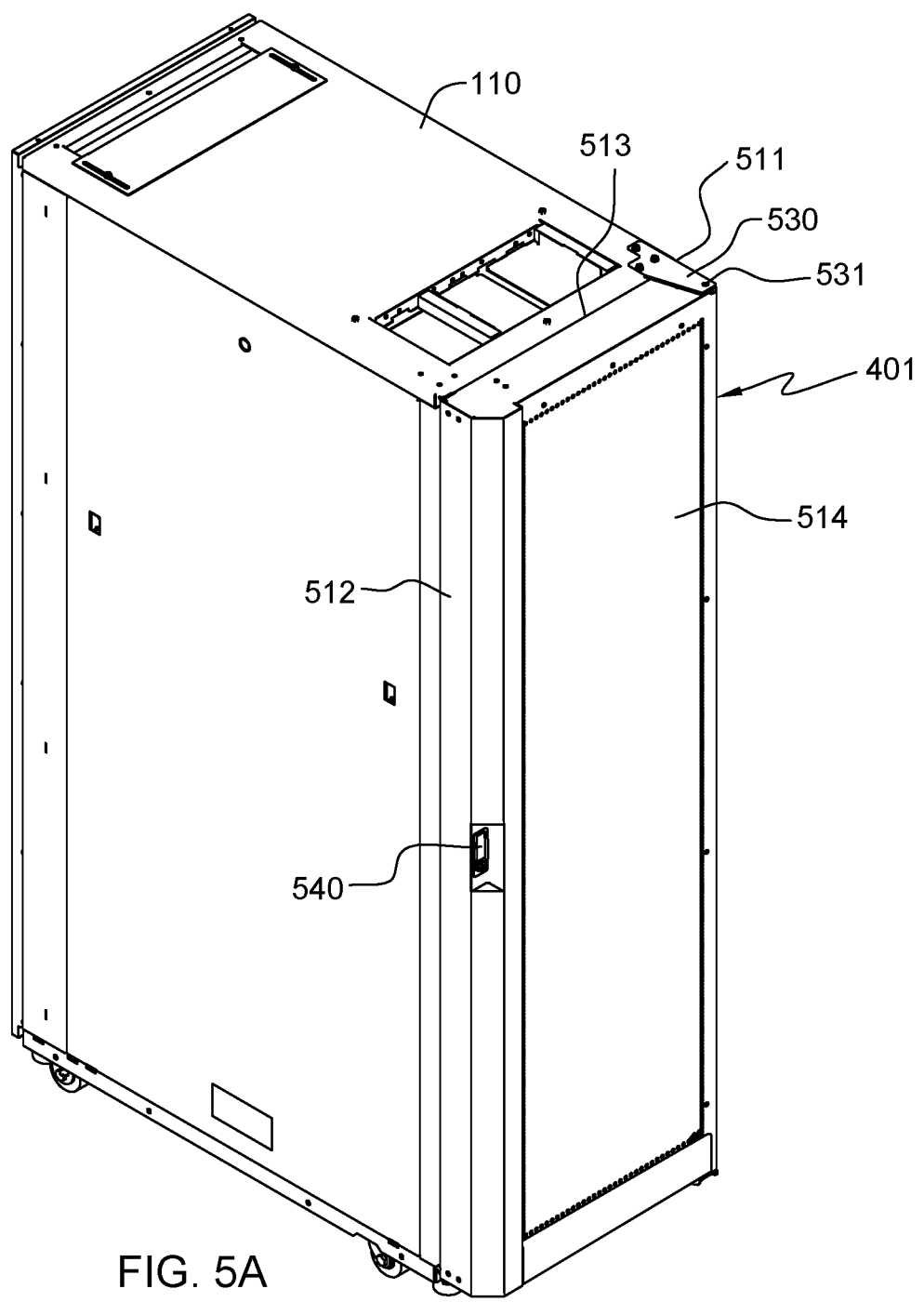
FIG. 5A depicts one embodiment of an electronics rack and heat exchanger door disposed at an air-inlet side or air-outlet side of the rack, in accordance with one or more aspects of the present invention.
Figure 5B:
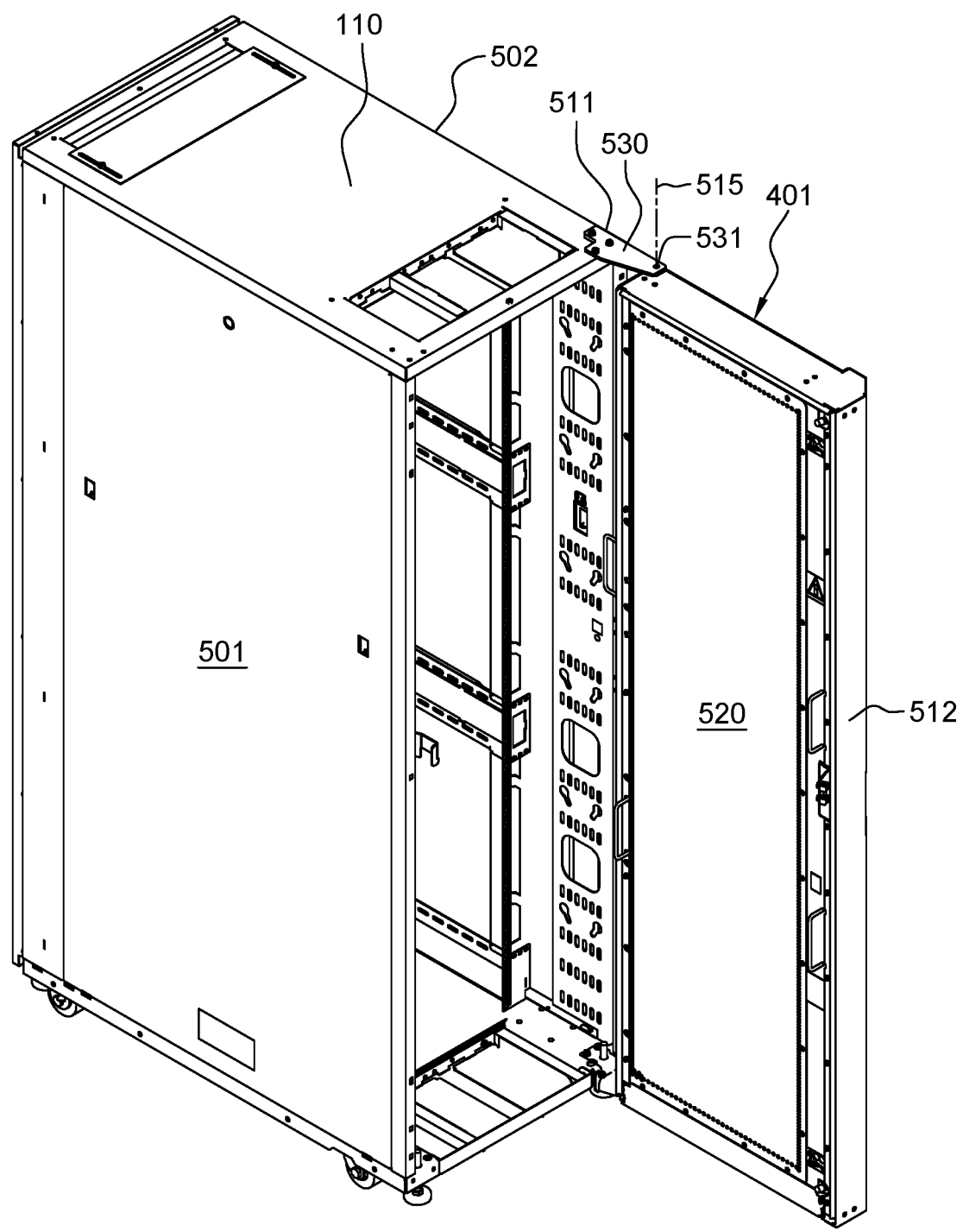
FIG. 5B depicts the electronics rack and heat exchanger door of FIG. 5A, with the heat exchanger door shown in an open position, in accordance with one or more aspects of the present invention.

FIGS. 5A & 5B depict one embodiment of an assembly comprising a heat exchanger door 401 hingedly mounted at a vertically-extending hinge edge 511 of the heat exchanger door to an electronics rack 110 at, for example, an air-outlet side of the electronics rack. Heat exchanger door 401 includes an air-to-coolant heat exchanger 520 (FIG. 5B) having, for instance, a larger height than width. In the embodiment depicted, heat exchanger door 401 includes, in addition to hinge edge 511, a vertically-extending latch edge 512 disposed opposite to hinge edge 511, and an inner side 513 and an outer side 514, which are opposite main sides of the heat exchanger door. In the embodiment depicted, inner side 513 is disposed closer to the air-outlet side or air-inlet side of electronics rack 500 with heat exchanger door 401 latched to the electronics rack, as illustrated in FIG. 5A. Heat exchanger door 401 mounts, in one embodiment, via top and bottom hinge brackets 530 and hinge pins 531 located at or adjacent to hinge edge 511 of heat exchanger door 401. As illustrated, hinge pins 531 can be positioned close to outer side 514 of heat exchanger door so that the hinge axis 515 is out from the electronics rack to, at least in part, minimize or even eliminate the outward swing of the heat exchanger door past electronics rack sides 501, 502, as heat exchanger door 401 is rotated between open and closed positions. A door latch mechanism 540 is disposed (in one embodiment) adjacent to latch edge 512 and is configured to facilitate latching of heat exchanger door 401 to electronics rack 110 when in the closed position (illustrated in FIG. 5A). Perforated screens can be provided at inner side 513 and/or outer side 514 of heat exchanger door 401, if desired.

FIGS. 6A-7D depict one embodiment of a multi-coolant, air-to-coolant heat exchanger 600 for a heat exchanger door such as described above.

Referring initially to FIGS. 6A-6D, air-to-coolant heat exchanger 600 is shown partially assembled with, for instance, one thermally conductive fin 640 being shown for purpose of illustration. In implementation, a plurality of thermally conductive fins 640 extend vertically within the heat exchanger door to facilitate cooling of air passing across the heat exchanger. In one or more embodiments, the plurality of thermally conductive fins 640 attach to one or more heat exchanger tube sections 630 of the heat exchanger. As noted, with flow of the first coolant and/or the second coolant through the multi-coolant heat exchanger, an airflow 601 passing across the heat exchanger is cooled, providing a cooled airflow 602.

In the implementation depicted, multiple multi-coolant heat exchanger sections 630 are illustrated, with each section being connected to a coolant supply manifold 610 and a coolant return manifold 620. In one or more other embodiments, a single heat exchanger section could be configured to extend between the supply and the return manifolds, or additional heat exchanger sections could be provided between the supply and return manifolds, if desired. In the implementation depicted, the coolant supply manifold 610 and coolant return manifold 620 are configured to extend vertically and be positioned within the heat exchanger door to mount to the electronics rack.

In one or more implementations, each heat exchanger section 630 is a multi-coolant heat exchanger section that defines two separate coolant flow paths through the heat exchanger section so that the first coolant and the second coolant do not mix within the heat exchanger. In the illustrated embodiment, coolant supply manifold 610 includes a first inlet 611 for receiving the first coolant, and a second inlet 612 for receiving the second coolant, with the first inlet 611 being in fluid communication with, for instance, an inner supply manifold of coolant supply manifold 610, and second inlet 612 being in fluid communication with an outer supply manifold, such as a manifold formed between an inner tube and an outer tube of coolant supply manifold 610. An example of this is depicted in FIG. 6C, where first inlet 611 is in fluid communication with an inner supply manifold 613 within an inner manifold tube 614 of coolant supply manifold 610. Further, although not shown, second coolant inlet 612 is in fluid communication with an outer supply manifold, which includes openings 617 in mounting brackets 616 coupling inner manifold tube 614 to an outer manifold tube 615. In one or more implementations, inner manifold tube 614 is concentrically located relative to outer manifold tube 615. Note that the shape and configuration of openings 617 in the mounting bracket(s) 616 can vary, depending on the implementation. Between mounting brackets, an open cavity is defined between inner manifold tube 614 and outer manifold tube 615 which forms, at least in part, the outer supply manifold. In one or more implementations, first inlet 611 and second inlet 612 can each include quick connect couplings (not shown) to facilitate attachment of lines coupling coolant supply manifold 610 to the first coolant source and second coolant source, such as described above.

Figure 6A:
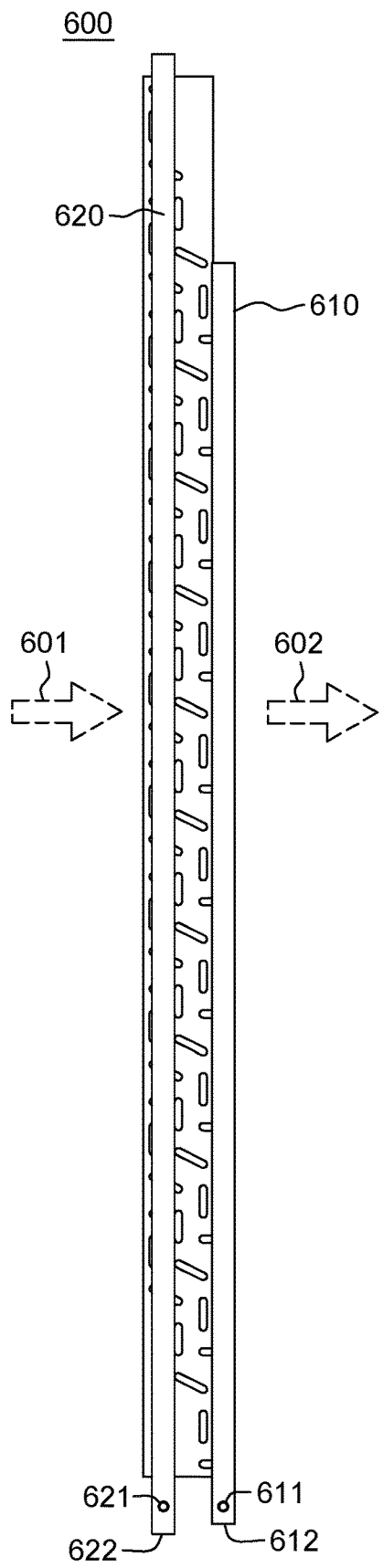
FIG. 6A is an elevational view of one embodiment of a partially assembled multi-coolant heat exchanger of a heat exchanger door, in accordance with one or more aspects of the present invention.
Figure 6B:
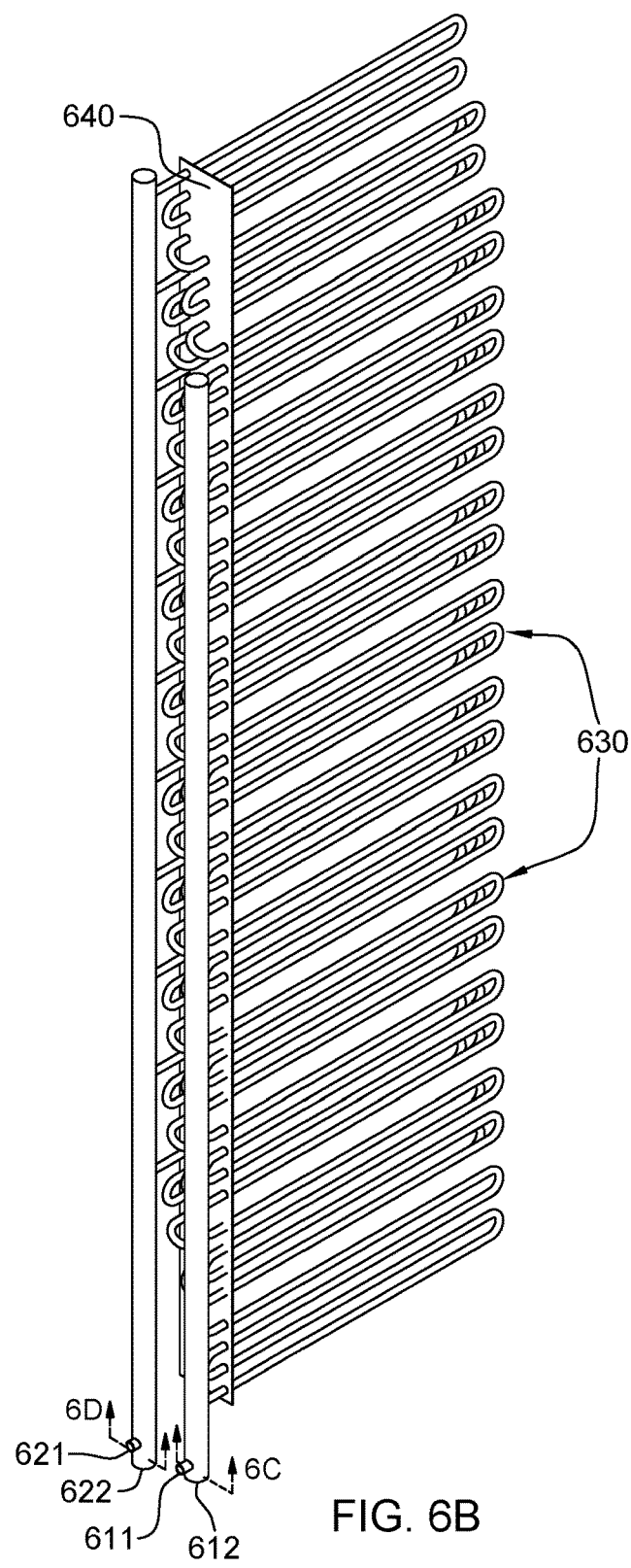
FIG. 6B further depicts the partially assembly multi-coolant heat exchanger of FIG. 6A, in accordance with one or more aspects of the present invention.
Figure 6C:
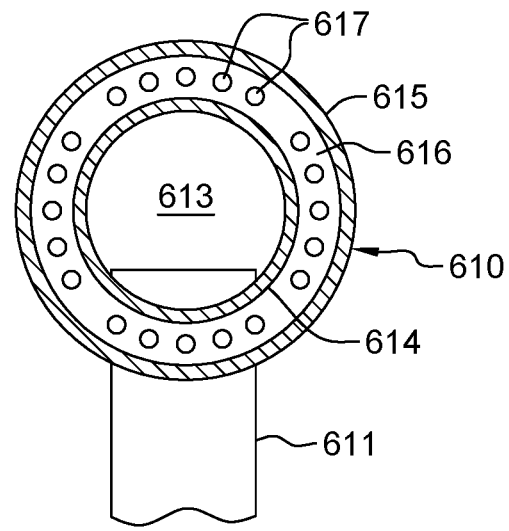
FIG. 6C is a cross-sectional elevational view of one embodiment of the multi-coolant supply manifold of FIG. 6B, taken along line 6C thereof, in accordance with one or more aspects of the present invention.
Figure 6D:
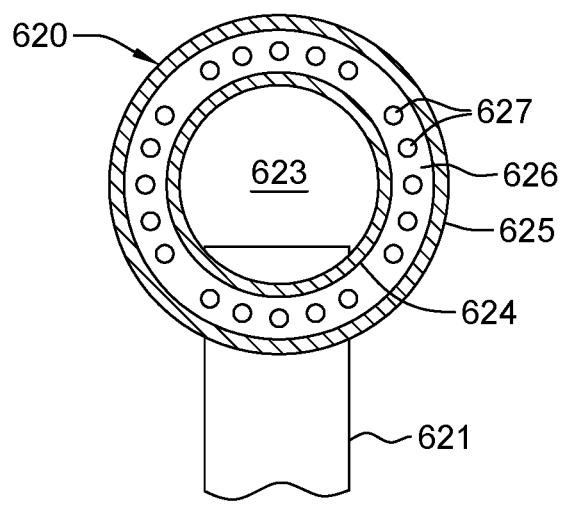
FIG. 6D is a cross-sectional elevational view of one embodiment of the multi-coolant return manifold of FIG. 6B, taken along line 6D thereof, in accordance with one or more aspects of the present invention.

Similarly, as shown in FIG. 6D, coolant return manifold 620 can include (in one embodiment) an inner return manifold 623 within an inner manifold tube 624, and an outer return manifold, including openings 627, between inner manifold tube 624 and an outer manifold tube 625. As shown, coolant return manifold 620 includes one or more mounting brackets 626 connecting in fixed position inner manifold tube 624 relative to outer manifold tube 625. For instance, in one or more embodiments, inner manifold tube 624 can be concentrically located relative to outer manifold tube 625. The outer return manifold includes openings 627 through one or more mounting brackets 626, as well as cavities within multi-coolant return manifold defined between inner manifold tube 624 and outer manifold tube 625.

As illustrated in FIGS. 6B & 6D, a first outlet 621 is provided in fluid communication with inner return manifold 623, and a second outlet 622 is provided in fluid communication with the outer return manifold. As with the first and second inlets 611, 612, quick connect couplings can be provided in association with first and second outlets 621, 622, if desired.

FIGS. 7A-7D depict in greater detail one embodiment of a multi-coolant, or dual-coolant, heat exchanger section 630, in accordance with one or more aspects of the present invention.

Referring collectively to FIGS. 7A-7D, in the implementation depicted, multi-coolant heat exchanger section 630 includes multiple straight tube segments, with each straight tube segment being interconnected by one or more connector segments at the ends of the straight tube segments. This configuration advantageously facilitates assembly or manufacture of the multi-coolant heat exchanger by allowing the plurality of thermally conductive fins 640 to be attached (e.g., brazed) to the straight tube segments prior to coupling the connector segments to the straight tube segments at least, for instance, on one side of the straight tube segments. In one or more implementations, the plurality of thermally conductive fins 640 are in physical contact with at least the straight tube segments in order to facilitate conduction of heat from air passing across the air-to-coolant heat exchanger to the first coolant and/or second coolant flowing through the multi-coolant heat exchanger.

As noted, in one or more embodiments, multi-coolant heat exchanger tube section 630 includes a connection at one end to the coolant supply manifold 610, and a connection at another end to the coolant return manifold 620. In the embodiment illustrated, the straight tube segments of the multi-coolant heat exchanger section 630 include an inner tube 710 positioned within an outer tube 700. As shown, inner tube 710 defines a first inner coolant-carrying channel 711, and a second outer coolant-carrying channel 701 is defined between inner tube 710 and outer tube 700, which includes the illustrated openings in a bracket 705 fixedly positioning inner tube 710 relative to outer tube 700. In one or more embodiments, one or more of these tube segments can be concentric tube segments, with inner tube 710 being concentrically positioned with respect to outer tube 700. Note also that the openings in bracket(s) 705 can vary depending on the implementation, as can the number of brackets 705 holding inner tube 710 in position within outer tube 700.

Figure 7C:
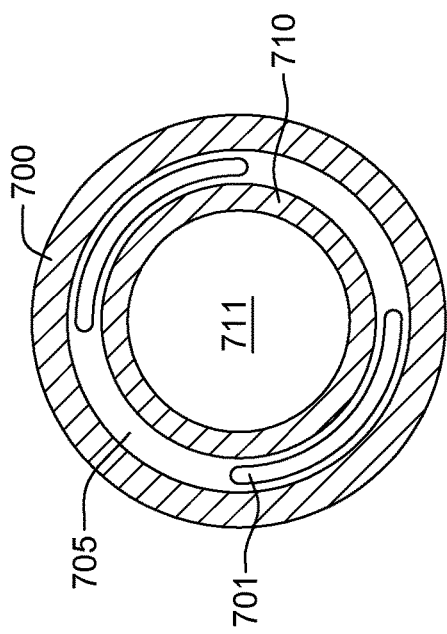
FIG. 7C is an enlarged cross-sectional depiction of one embodiment of a tube segment of the multi-coolant heat exchanger of FIG. 7B, taken along line 7C thereof, in accordance with one or more aspects of the present invention.

In the embodiment of FIGS. 7A-7C, an end of inner tube 710 is sized to extend into multi-coolant supply manifold 610 so as to connect into the inner manifold tube, so that the inner coolant-carrying channel is in fluid communication with the inner supply manifold. Further, at the same end, outer tube 700 is sized to connect to the outer tube of coolant supply manifold 610 so that the outer coolant-carrying channel defined between the inner tube 710 and outer tube 700 of the tube segment is in fluid communication with the outer supply manifold. At the opposite end of the multi-coolant heat exchanger section 630, inner tube 710 and outer tube 700 are coupled in a similar manner to the inner return manifold tube and the outer return manifold tube, respectively, such that the first coolant in the inner supply manifold flows through the inner coolant-carrying channels of the heat exchanger section to the inner return manifold, and the second coolant separately flows through the outer coolant-carrying channels between the inner and outer tubes of the heat exchanger section, from the outer supply manifold of coolant supply manifold 610 to the outer return manifold of coolant return manifold 620. Note that in this example, the first coolant and second coolant flow through the multi-coolant heat exchanger section in a common direction. In one or more other implementations, the multi-coolant supply manifold and multi-coolant return manifold can be differently configured such that the first coolant and second coolant flow through the heat exchanger section in opposite directions, if desired.

Figure 7D:
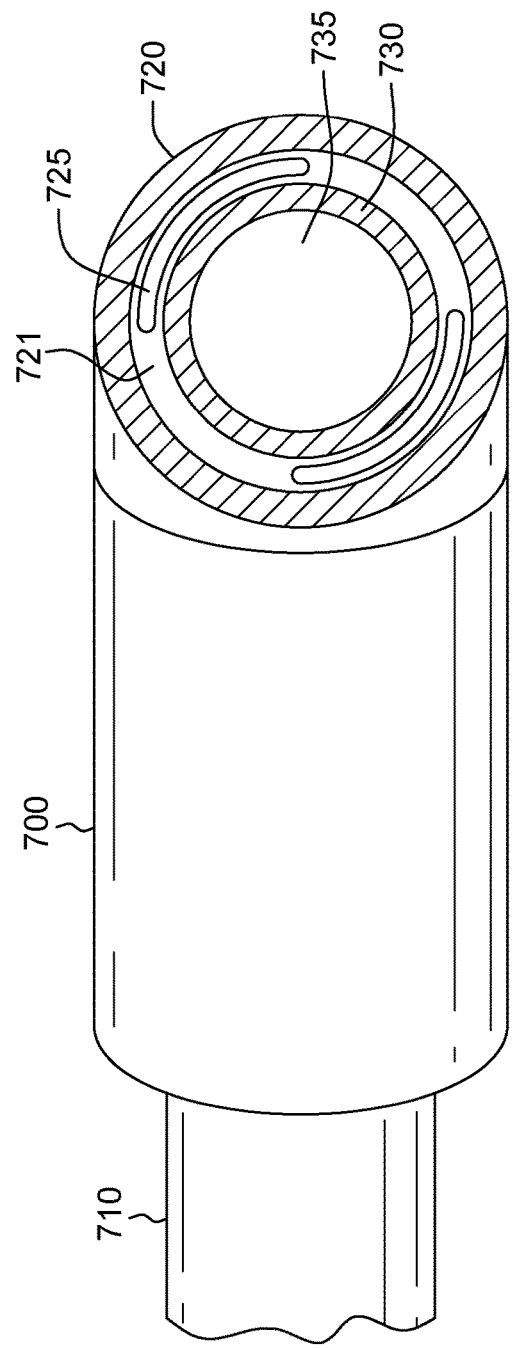
FIG. 7D is a partial cross-sectional depiction of one embodiment of a connector segment of the multi-coolant heat exchanger of FIG. 7A, taken along line 7D-7D thereof, in accordance with one or more aspects of the present invention.

FIG. 7D depicts one embodiment of a curved connector segment of the multi-coolant heat exchanger section 630, which connects in fluid communication two straight tube segments of the air-to-coolant heat exchanger. As illustrated in FIG. 7D, the connector segment includes a curved inner tube 730 within a curved outer tube 720. For instance, in one embodiment, curved inner tube 730 can be positioned concentrically with respect to curved outer tube 720, and be held in position via, for instance, one or more brackets 721. In this embodiment, curved inner tube 730 defines an inner connector coolant-carrying channel 735, and the cavity between curved inner tube 730 and curved outer tube 720 defines an outer connector coolant-carrying channel, which includes openings 725 in brackets 721. As noted, in one or more implementations, the plurality of thermally conductive fins can be connected to at least the straight tube segments, with the connector segments, such as the curved connector segment illustrated in FIGS. 7A & 7D, being attached to adjacent straight tube segments after attaching the thermally conductive fins to the tube segments.

FIGS. 8A-9C depict different embodiments for connecting a respective connector segment to first and second tube segments of the multi-coolant heat exchanger section.

Referring initially to FIGS. 8A-8F, in one or more embodiments, connector fittings 815 connect in fluid communication a first tube segment 800 to one end of a curved connector segment 805, and a second tube segment 810 to another end of curved connector segment 805. By way of example, first and second tube segments 800, 810 are shown as adjacent tube segments joined by the curved connector segment, such as illustrated in the multi-coolant heat exchanger section of FIGS. 7A-7D.

In the embodiment depicted in FIGS. 8A-8F, one fitting 815 connects a respective tube segment 800, 810 to the curved connector segment 805, with the inner coolant-carrying channel of the tube segment in fluid communication with the inner connector coolant-carrying channel of the connector segment through the fitting, and the outer coolant-carrying channel of the tube segment in fluid communication with the outer connector coolant-carrying channel of the connector segment through the fitting. As illustrated in FIG. 8F, fitting 815 includes a first circular-shaped cavity 816 at one end that aligns with and accepts an end of the inner tube of the connector segment, and a second circular-shaped cavity 817 that aligns with and accepts an end of the outer tube of the connector segment. Similar third and fourth cavities are provided at the opposite end of fitting 815 to receive the ends of the inner and outer tubes of the tube segment. Fitting 815 further includes an inner channel 812 and an outer channel 811 (disposed between an inner tube and outer tube of the fitting 815). In one or more embodiments, a bracket 818 is provided to hold in position the inner tube relative to outer tube of fitting 815.

During assembly, the tube segment and connector segment can be sealed to the respective fitting by, for instance, brazing or soldering to form a fluid-tight coupling of the tube segment to the connector segment, with the inner coolant-carrying channel of the tube segment in fluid communication with the inner connector coolant-carrying channel of the connector segment, and the outer coolant-carrying channel of the tube segment in fluid communication with the outer connector coolant-carrying channel of the connector segment. In one or more implementations, fittings 815, as well as the tube and connector segments, are formed of a metal, such as copper, or of a copper alloy. By way of example, the tube segment can be brazed to fitting 815, as can the connector segment by, for instance, filling the respective circular-shaped cavities or grooves in the fitting with a braze material, inserting the ends of the tube segment and the connector segment into the fitting, and then heating the assembly to melt the braze material, thereby forming fluid-tight joints between the tube segment and fitting, and the fitting and the connector segment. Note that the circular shape of the cavity or grooves in the fitting is selected to correspond to the cross-sectional shape of the inner and/or outer tubes of the tube segment, as well as to the cross-sectional shape of the inner and outer tubes of the connector segment.

FIGS. 9A-9C depict an alternate embodiment of a method of coupling tube segments 800, 810 to a common connector segment 805. By way of example, tube segments 800, 810 and connector segment 805 are assumed to be configured as described above in connection with FIGS. 7A-8D.

Referring to FIG. 9A, in one or more embodiments, inner tubes 710 of tube segments 800, 810 are exposed at one end where the tube segments are to connect to the connector segment, as is inner tube 730 of connector segment 805. As illustrated, the inner tubes 710, 730 are assumed to have a similar size and configuration such that the inner tubes can be fluidly sealed together by a circumferential braze, solder or weld joint 910, with the inner coolant-carrying channels 711 of the tube segments in fluid communication through the inner connector coolant-carrying channel 735 of connector segment 805. Once the inner tubes are coupled in fluid communication, appropriately sized sleeve fittings 900 are slid over the gap between the ends of the tube segments 800, 810 and the connector segment 805, and then sealed in a fluid-tight manner to the outer tubes 700, 720, defining a channel or chamber 905 that couples in fluid communication outer coolant-carrying channels 701 of tube segments 800, 810 to the outer connector coolant-carrying channel 725 of connector segment 805. In one or more implementations, sleeve fittings 900 can be formed of a metal, such as copper or a copper alloy, and be circumferentially brazed, soldered or welded at opposite ends to the tube and connector segments to form a fluid-tight seal.

Those skilled in the art will note from the description provided herein that the tube segments and connector segments of the multi-coolant heat exchanger sections can have a variety of configurations. For instance, in one or more embodiments, the tube segments attached to the plurality of fins can have other than a straight tube configuration, and the connector segments connecting two tube segments together can a configuration other than a U-shaped configuration, such as depicted in FIGS. 6A-9C. Further, multiple connector segments can be employed to fluidly connect two multi-coolant tube segments together.

Figure 10:
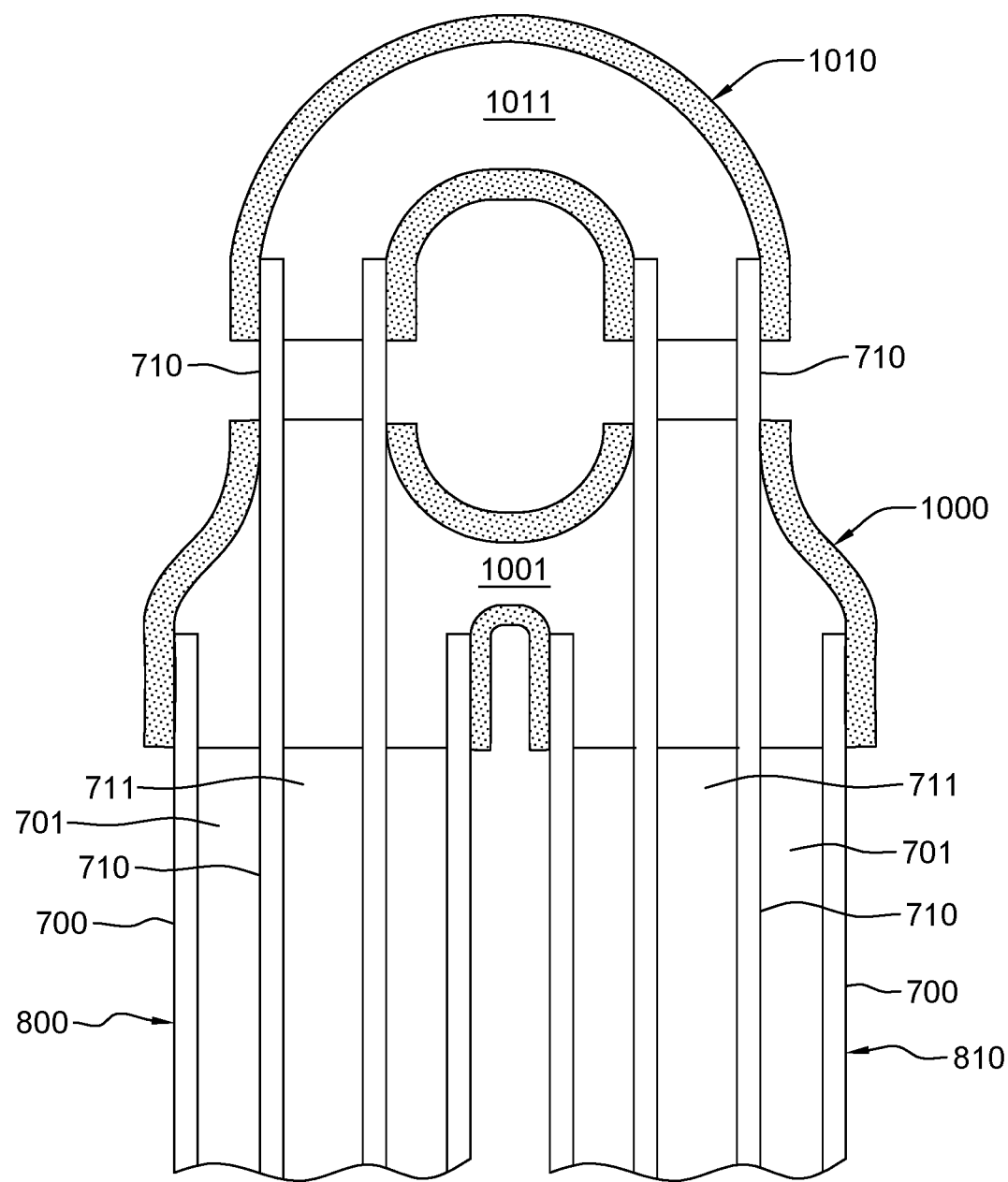
FIG. 10 depicts another embodiment of connector segments of a multi-coolant heat exchanger, such as depicted in FIGS. 6A-7D, in accordance with one or more aspects of the present invention.

By way of example, FIG. 10 depicts an alternate connector embodiment where a first connector segment 1000 has a chamber 1001 which couples in fluid communication the outer coolant-carrying channels of two tube segments 800, 810, and a second connector segment 1010 has a channel 1011 coupling in fluid communication the inner coolant-carrying channels of the tube segments 800, 810. With this connector segment configuration, the tube segments 800, 810 can be configured with inner tubes 810 extending an appropriate distance out from the outer tubes 700, such that the first connector segment 1000 can be fitted over the inner tubes 710, and outer tubes 700, as illustrated. With this placement of connector segment 1000, the connector segment can then be sealed to the inner and outer tubes 710, 700 by, for instance, brazing, soldering, or welding the connector segment to the tube segments. The exposed portion of inner tubes 710 extending through connector segment 1000 allows for attachment of connector segment 1010 to the inner tubes 710, such as by brazing or soldering to the outer surface of the inner tubes. In this manner, inner coolant-carrying channels 711 of tube segments 800, 810 are in fluid communication through channel 1011 of second connector segment 1010, and outer coolant-carrying channels 701 of tube segments 800, 810 are in fluid communication through chamber 1001 of first connector segment 1000.

Those skilled in the art will note from the description provided herein that a multi-coolant heat exchanger is provided configured to facilitate cooling airflow through an electronics rack. Advantageously, the multi-coolant heat exchanger separately receives a first coolant and a second coolant with, for instance, the first coolant being actively cooled, and the second coolant being passively cooled. For instance, the first coolant can be a lower-temperature fluid that is refrigeration-cooled, and the second coolant can be an outside-heat-sink-cooled fluid. In this manner, the first coolant can supplement cooling provided by the second coolant, for instance, dependent on the outside conditions.

In order to meet objectives for a heat exchanger door, an inner coolant loop is provided within an outer coolant loop as part of the multi-coolant heat exchanger. By way of example, the heat exchanger can be embodied as a concentric tube heat exchanger, with one coolant circuit accepting the higher-temperature coolant, and another coolant circuit accepting the lower-temperature coolant. In implementation, the lower-temperature coolant is passed through the inner coolant circuit of the concentric tube heat exchanger. In one implementation, fabricating a concentric tube heat exchanger can include using a concentric tube fitting and brazing to attach the inner and outer tubes of a tube segment to an appropriate connector segment. In one embodiment, the fitting includes passageways or channels to allow the coolants to separately flow through the fitting, and thereby connect in fluid communication the tube segment and the connector segment. Multiple embodiments of the fitting, as well as the connector segment, are possible.

Advantageously, disclosed herein is a concentric tube heat exchanger with dual-fluid cooling, where an inner concentric tube is concentrically positioned with respect to an outer tube, and held in place via one or more brackets. The inner tube receives a lower-temperature fluid, and the outer tube accepts a higher-temperature fluid, where the lower-temperature fluid and higher-temperature fluid do not mix within the heat exchanger, and both assist in cooling airflow through the electronics rack. A first end of a braze fitting is coupled to one concentric tube, where a first cavity of the braze fitting aligns with and accepts the inner tube, and a second cavity of the braze fitting aligns with and accepts the outer tube. Similarly, a second end of the braze fitting is coupled to another concentric tube, such as a connector segment as described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
an air-to-coolant heat exchanger configured to cool, at least in part, air passing through an electronics rack, the air-to-coolant heat exchanger comprising:
a first tube segment with a first inner tube positioned within a first outer tube, and defining a first inner coolant-carrying channel and a first outer coolant-carrying channel;
a second tube segment with a second inner tube positioned within a second outer tube, and defining a second inner coolant-carrying channel and a second outer coolant-carrying channel;
at least one connector segment coupling in fluid communication at least one of the first and second inner coolant-carrying channels of the first and second tube segments, or the first and second outer coolant-carrying channels of the first and second tube segments;
a plurality of thermally conductive fins attached to the first and second tube segments; and
wherein the air-to-coolant heat exchanger is coupled to separately receive a first coolant and a second coolant, the first coolant passing through the first and second inner coolant-carrying channels, and the second coolant passing through the first and second outer coolant-carrying channels.

2. The apparatus of claim 1, wherein the first tube segment is a first concentric tube segment with the first inner tube concentrically positioned with respect to the first outer tube, and the second tube segment is a second concentric tube segment with the second inner tube concentrically positioned with respect to the second outer tube.

3. The apparatus of claim 2, wherein the first coolant is a lower-temperature fluid and the second coolant is a higher-temperature fluid, the higher-temperature fluid being at a higher temperature than the lower-temperature fluid.

4. The apparatus of claim 3, wherein the lower-temperature fluid is a refrigeration-cooled fluid, and the higher-temperature fluid is an outside-heat-sink-cooled fluid.

5. The apparatus of claim 2, wherein the at least one connector segment comprises a curved concentric tube segment with a curved inner tube concentrically positioned with respect to a curved outer tube, and which define an inner connector coolant-carrying channel and an outer connector coolant-carrying channel, the inner connector coolant-carrying channel connecting in fluid communication the first and second inner coolant-carrying channels of the first and second tube segments, and the outer connector coolant-carrying channel connecting in fluid communication the first and second outer coolant-carrying channels of the first and second tube segments.

6. The apparatus of claim 5, further comprising a fitting coupling the first concentric tube segment and the curved concentric tube segment, the fitting including a first cavity at a first end that aligns with and accepts an end of the first inner tube, and a second cavity at the first end that aligns with an accepts an end of the first outer tube, and the fitting including a third cavity at a second end that aligns with and accepts an end of the curved inner tube of the curved concentric tube segment, and a fourth cavity at the second end that aligns with and accepts an end of the curved outer tube of the curved concentric tube segment, with the first inner coolant-carrying channel being in fluid communication with the inner connector coolant-carrying channel through the fitting, and the first outer coolant-carrying channel being in fluid communication with the outer connector coolant-carrying channel through the fitting.

7. The apparatus of claim 5, wherein an end of the curved inner tube of the curved concentric tube segment is coupled to an end of the first inner tube of the first concentric tube segment, and the apparatus further comprises a sleeve fitting coupling the first concentric tube segment and the curved concentric tube segment, with the first outer coolant-carrying channel of the first concentric tube segment in fluid communication with the outer connector coolant-carrying channel of the curved concentric tube segment through the sleeve fitting.

8. The apparatus of claim 2, wherein the at least one connector segment comprises a first connector segment and a second connector segment, the first connector segment being sealed to the first inner tube and the first outer tube of the first concentric tube segment, and being sealed to the second inner tube and the second outer tube of the second concentric tube segment, and including an outer connector coolant-carrying channel connecting in fluid communication the first and second outer coolant-carrying channels, and the second connector segment being sealed to the first inner tube of the first concentric tube segment and the second inner tube of the second concentric tube segment, and including an inner connector coolant-carrying channel connecting in fluid communication the first and second inner coolant-carrying channels of the first and second concentric tube segments.

9. The apparatus of claim 1, wherein the first tube segment is a first straight tube segment, and the second tube segment is a second straight tube segment, and the at least one connector segment comprises at least one curved tube segment attached to and coupling in fluid communication the first straight tube segment and the second straight tube segment, and wherein the plurality of thermally conductive fins extend between and attach to the first and second straight tube segments.

10. An apparatus comprising:
a heat exchanger door configured to couple to an electronics rack, the heat exchanger door including an air-cooled heat exchanger configured to cool, at least in part, air passing through the electronics rack, the air-cooled heat exchanger comprising:
a first tube segment with a first inner tube positioned within a first outer tube, and defining a first inner coolant-carrying channel and a first outer coolant-carrying channel;
a second tube segment with a second inner tube positioned within a second outer tube, and defining a second inner coolant-carrying channel and a second outer coolant-carrying channel;
at least one connector segment coupling in fluid communication at least one of the first and second inner coolant-carrying channels of the first and second tube segments, or the first and second outer coolant-carrying channels of the first and second tube segments;
a plurality of thermally conductive fins attached to the first and second tube segments; and
wherein the air-to-coolant heat exchanger is coupled to separately receive a first coolant and a second coolant, the first coolant passing through the first and second inner coolant-carrying channels, and the second coolant passing through the first and second outer coolant-carrying channels.

11. The apparatus of claim 10, wherein the first tube segment is a first concentric tube segment with the first inner tube concentrically positioned with respect to the first outer tube, and the second tube segment is a second concentric tube segment with the second inner tube concentrically positioned with respect to the second outer tube.

12. The apparatus of claim 11, wherein the first coolant is a lower-temperature fluid and the second coolant is a higher-temperature fluid, the higher-temperature fluid being at a higher temperature than the lower-temperature fluid.

13. The apparatus of claim 12, wherein the lower-temperature fluid is a refrigeration-cooled fluid, and the higher-temperature fluid is an outside heat-sink-cooled fluid.

14. The apparatus of claim 11, wherein the at least one connector segment comprises a curved concentric tube segment with a curved inner tube concentrically positioned with respect to a curved outer tube, and which define an inner connector coolant-carrying channel and an outer connector coolant-carrying channel, the inner connector coolant-carrying channel connecting in fluid communication the first and second inner coolant-carrying channels of the first and second tube segments, and the outer connector coolant-carrying channel connecting in fluid communication the first and second outer coolant-carrying channels of the first and second tube segments.

15. The apparatus of claim 14, further comprising a fitting coupling the first concentric tube segment and the curved concentric tube segment, the fitting including a first cavity at a first end that aligns with and accepts an end of the first inner tube, and a second cavity at the first end that aligns with an accepts an end of the first outer tube, and the fitting including a third cavity at a second end that aligns with and accepts an end of the curved inner tube of the curved concentric tube segment, and a fourth cavity at the second end that aligns with and accepts an end of the curved outer tube of the curved concentric tube segment, with the first inner coolant-carrying channel being in fluid communication with the inner connector coolant-carrying channel through the fitting, and the first outer coolant-carrying channel being in fluid communication with the outer connector coolant-carrying channel through the fitting.

16. The apparatus of claim 14, wherein an end of the curved inner tube of the curved concentric tube segment is coupled to an end of the first inner tube of the first concentric tube segment, and the apparatus further comprises a sleeve fitting coupling the first concentric tube segment and the curved concentric tube segment, with the first outer coolant-carrying channel of the first concentric tube segment in fluid communication with the outer connector coolant-carrying channel of the curved concentric tube segment through the sleeve fitting.

17. The apparatus of claim 11, wherein the at least one connector segment comprises a first connector segment and a second connector segment, the first connector segment being sealed to the first inner tube and the first outer tube of the first concentric tube segment, and being sealed to the second inner tube and the second outer tube of the second concentric tube segment, and including an outer connector coolant-carrying channel connecting in fluid communication the first and second outer coolant-carrying channels, and the second connector segment being sealed to the first inner tube of the first concentric tube segment and the second inner tube of the second concentric tube segment, and including an inner connector coolant-carrying channel connecting in fluid communication the first and second inner coolant-carrying channels of the first and second concentric tube segments.

18. A method comprising:
fabricating an air-cooled heat exchanger to cool, at least in part, air passing through an electronics rack, the fabricating comprising:
providing a first tube segment with a first inner tube segment positioned within a first outer tube, and defining a first inner coolant-carrying channel and a first outer coolant-carrying channel;
providing a second tube segment with a second inner tube positioned within a second outer tube, and defining a second inner coolant-carrying channel and a second outer coolant-carrying channel;
attaching a plurality of thermally conductive fins to the first and second tube segments;
providing at least one connector segment coupling in fluid communication at least one of the first and second inner coolant-carrying channels of the first and second tube segments, or the first and second outer coolant-carrying channels of the first and second tube segments; and
wherein the air-to-coolant heat exchanger is configured to separately receive a first coolant and a second coolant, with the first coolant passing through the first and second inner coolant-carrying channels, and the second coolant passing through the first and second outer coolant-carrying channels.

19. The method of claim 18, wherein the first tube segment is a first concentric tube segment with the first inner tube concentrically positioned with respect to the first outer tube, and the second tube segment is a second concentric tube segment with the second inner tube concentrically positioned with respect to the second outer tube.

20. The method of claim 19, wherein the first coolant is a lower-temperature fluid and the second coolant is a higher-temperature fluid, the higher-temperature fluid being at a higher temperature than the lower-temperature fluid, and wherein the lower-temperature fluid is a refrigeration-cooled fluid, and the higher-temperature fluid is an outside-heat-sink-cooled fluid.

* * * * *